US012677442B2

(12) United States Patent
Kim et al.

(10) Patent No.: US 12,677,442 B2
(45) Date of Patent: Jul. 7, 2026

(54) SEMICONDUCTOR DEVICE

(71) Applicant: Samsung Electronics Co., Ltd., Suwon-si (KR)

(72) Inventors: Wandon Kim, Suwon-si (KR); Jaeseoung Park, Suwon-si (KR); Hyunwoo Kim, Suwon-si (KR); Hyunbae Lee, Suwon-si (KR); Jeonghyuk Yim, Suwon-si (KR); Hyoseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 405 days.

(21) Appl. No.: 18/243,818

(22) Filed: Sep. 8, 2023

(65) Prior Publication Data

US 2024/0222451 A1     Jul. 4, 2024

(30) Foreign Application Priority Data

Dec. 29, 2022    (KR) ......................... 10-2022-0188130

(51) Int. Cl.
H01L 29/417        (2006.01)
H01L 29/06         (2006.01)
(Continued)

(52) U.S. Cl.
CPC ......... H10D 30/6729 (2025.01); H10D 30/43 (2025.01); H10D 30/6735 (2025.01);
(Continued)

(58) Field of Classification Search
CPC ............... H10D 30/6729; H10D 30/43; H10D 30/6735; H10D 30/6757; H10D 62/121;
(Continued)

(56) References Cited

U.S. PATENT DOCUMENTS 10,109,490 B1    10/2018  Lin et al.
2015/0179579 A1   6/2015  Jezewski et al.
(Continued)

FOREIGN PATENT DOCUMENTS

JP          2012069636 A      4/2012
KR          101670620 B1     10/2016
(Continued)

*Primary Examiner* — Tong-Ho Kim
(74) *Attorney, Agent, or Firm* — Muir Patent Law, PLLC

(57)              ABSTRACT
A semiconductor device includes an active region extending in a first direction, a gate structure extending in a second direction, a source/drain region on the active region, a first contact structure connected to the source/drain region, and a second contact structure connected to the first contact structure. The second contact structure includes a first layer including a first grain and a second layer including second grains on the first layer. Within the first layer, a maximum vertical distance between a lowermost end of the first grain and an uppermost end of the first grain is equal to a vertical distance between a lowermost end of the first layer and an uppermost end of the first layer. A size of the first grain is greater than a size of each of the second grains. A width of the first layer is greater than a width of the first contact structure.

20 Claims, 23 Drawing Sheets

(51) Int. Cl.

| | | |
|---|---|---|
| *H01L 29/423* | (2006.01) | |
| *H01L 29/775* | (2006.01) | |
| *H01L 29/786* | (2006.01) | |
| *H10D 30/43* | (2025.01) | |
| *H10D 30/67* | (2025.01) | |
| *H10D 62/10* | (2025.01) | |
| *H10D 64/23* | (2025.01) | |

(52) U.S. Cl.
CPC ....... *H10D 30/6757* (2025.01); *H10D 62/121* (2025.01); *H10D 64/258* (2025.01)

(58) Field of Classification Search
CPC .. H10D 64/258; H10D 30/014; H10D 62/151; H10D 64/251; H10D 64/256; H10D 64/254
USPC ......................................................... 257/288
See application file for complete search history.

(56) References Cited

U.S. PATENT DOCUMENTS

| | | | | |
|---|---|---|---|---|
| 2017/0103948 | A1 | 4/2017 | Lee et al. | |
| 2018/0108610 | A1* | 4/2018 | Yang ................... | H01L 21/7684 |
| 2019/0189508 | A1 | 6/2019 | Peethala et al. | |
| 2022/0069100 | A1 | 3/2022 | Hwang et al. | |
| 2022/0069129 | A1 | 3/2022 | Kim et al. | |
| 2022/0246528 | A1* | 8/2022 | Choi ................ | H01L 21/76879 |
| 2022/0310805 | A1* | 9/2022 | Chun ................ | H10D 30/6219 |

FOREIGN PATENT DOCUMENTS

| | | |
|---|---|---|
| KR | 1020220030455 A | 3/2022 |
| KR | 1020220030456 A | 3/2022 |
| WO | 2014105477 A1 | 7/2014 |

* cited by examiner

'B'

SEMICONDUCTOR DEVICE

CROSS-REFERENCE TO RELATED APPLICATION(S)

This application claims benefit of priority under 35 U.S.C. § 119 to Korean Patent Application No. 10-2022-0188130 filed on Dec. 29, 2022, in the Korean Intellectual Property Office, the disclosure of which is incorporated herein by reference in its entirety.

BACKGROUND

The present inventive concept relates to a semiconductor device.

As demand for high performance, high speed, and multifunctionality of semiconductor devices increases, a degree of integration of semiconductor devices has been increasing. In response to the trend for a high degree of integration of semiconductor devices, transistors have been reduced in size. Interconnections, electrically connected to the transistor having a reduced size, have been reduced in size. However, an increase in resistance of the interconnections and an increase in capacitance between the interconnections make it difficult to implement a high-speed operation.

SUMMARY

The present inventive concept provides a semiconductor device having improved electrical properties.

According to an example embodiment of the present inventive concept, there is provided a semiconductor device including an active region extending in a first direction on a substrate, a gate structure extending in a second direction on the substrate, intersecting the active region, and including a gate electrode, a source/drain region on the active region on at least one side of the gate structure, a first contact structure connected to the source/drain region on the at least one side of the gate structure, and a second contact structure connected to the first contact structure on the first contact structure. The second contact structure may include a first layer including a first grain and a second layer including second grains on the first layer. Within the first layer, a maximum vertical distance between a lowermost end of the first grain and an uppermost end of the first grain may be equal to a vertical distance between a lowermost end of the first layer and an uppermost end of the first layer. A size of the first grain may be greater than a size of each of the second grains. A width of the first layer may be greater than a width of the first contact structure.

According to an example embodiment of the present inventive concept, there is provided a semiconductor device including an active region extending in a first direction on a substrate, a gate structure extending in a second direction on the substrate, intersecting the active region, and including a gate electrode, a source/drain region on the active region on at least one side of the gate structure, a first contact structure connected to the source/drain region on the at least one side of the gate structure, and a second contact structure connected to the first contact structure on the first contact structure. The second contact structure may include a first layer including a first grain and a second layer including second grains on the first layer. The first layer may include a monocrystalline conductive material. The second layer may include a polycrystalline conductive material. A size of the first grain may be greater than a size of each of the second grains.

According to an example embodiment of the present inventive concept, there is provided a semiconductor device including first and second interlayer insulating layers on a substrate, a first contact structure passing through the first interlayer insulating layer on the substrate, a second contact structure passing through the second interlayer insulating layer, the second contact structure in contact with an upper surface of the first contact structure, and a metal interconnection in contact with an upper surface of the second contact structure, the metal interconnection extending in a first direction. The second contact structure may include a first layer including a first grain and a second layer including second grains on the first layer. The first layer may include a monocrystalline conductive material. The second layer may include a polycrystalline conductive material. A size of the first grain may be greater than a size of each of the second grains. A width of the first layer may be greater than a width of the first contact structure.

BRIEF DESCRIPTION OF THE DRAWINGS

The above and other aspects and features of the present inventive concept will be more clearly understood from the following detailed description, taken in conjunction with the accompanying drawings, in which.

DETAILED DESCRIPTION OF THE EMBODIMENTS

Figure 1:
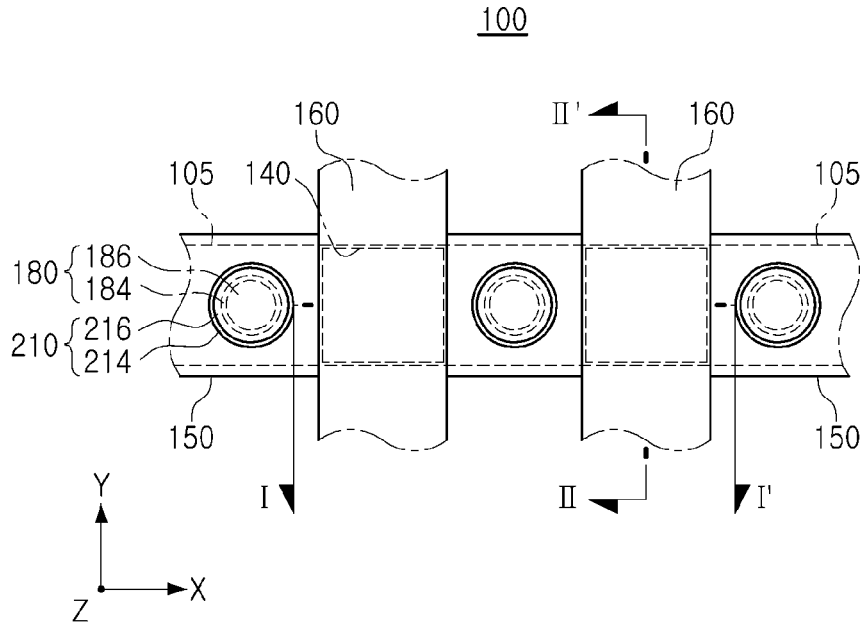
FIG. 1 is a plan view illustrating a semiconductor device according to an example embodiment of the present inventive concept.

Hereinafter, example embodiments of the present inventive concept will be described below with reference to the accompanying drawings.

In the drawings, the size and relative sizes of layers and regions may be exaggerated for clarity. Like numbers refer to like elements throughout. Items described in the singular may be provided in plural, as can be seen, for example, in the drawings. Thus, the description of a single item that is provided in plural applies to the remaining plurality of items, unless the context or other statements indicate otherwise.

Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

In the following description, it will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, the term "buried" may refer to structures, patterns, and/or layers that are formed at least partially below an upper surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

FIG. 1 is a plan view illustrating a semiconductor device according to an example embodiment of the present inventive concept.

Figure 2A:
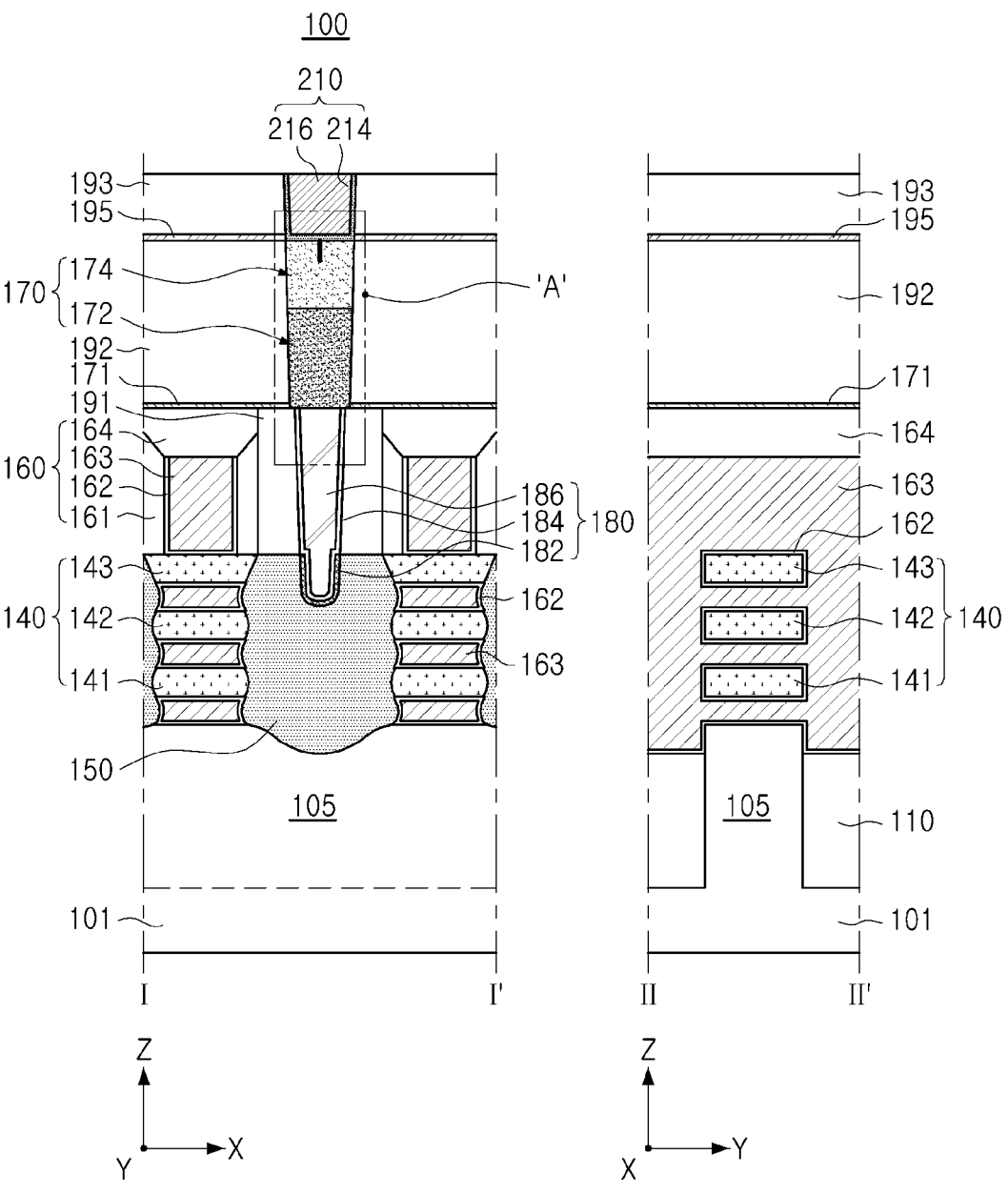
FIG. 2A is a cross-sectional view illustrating a semiconductor device according to an example embodiment of the present inventive concept.

FIG. 2A is a cross-sectional view illustrating a semiconductor device according to an example embodiment of the present inventive concept. FIG. 2A is a cross-sectional view of the semiconductor device of FIG. 1 taken along lines I-I' and II-II'.

Figure 2B:
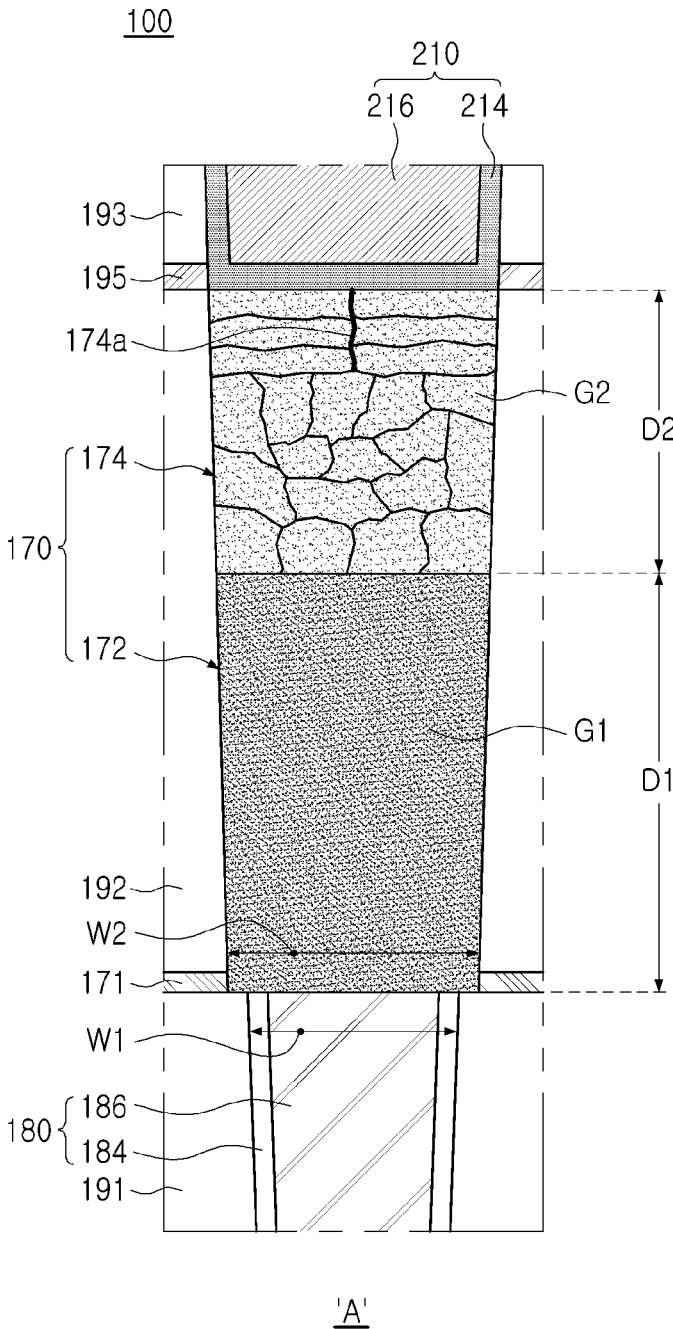
FIGS. 2B to 4C are partially enlarged cross-sectional views illustrating a semiconductor device each according to an example embodiment of the present inventive concept.

FIG. 2B is a partially enlarged cross-sectional view illustrating a semiconductor device according to an example embodiment of the present inventive concept. FIG. 2B is an enlarged view of region "A" of the semiconductor device of FIG. 2A. For ease of description, only main components of the semiconductor device are illustrated in FIGS. 1 to 2B.

Referring to FIGS. 1 to 2B, a semiconductor device 100 may include a substrate 101, an active region 105 on the substrate 101, a channel structure 140 including a plurality of channel layers 141, 142, and 143 disposed on the active region 105 and that are vertically spaced apart from each other, source/drain regions 150 in contact with the plurality of channel layers 141, 142, and 143, the source/drain regions 150 disposed on the active region 105 on opposite sides of a gate structure 160. The semiconductor device further includes the gate structure 160 extending below an upper surface of the active region 105, a first contact structure 180 connected to one of the source/drain regions 150, and a second contact structure 170 connected to the first contact structure 180. The semiconductor device 100 may further include a device isolation layer 110, interlayer insulating layers 191, 192, and 193, an etch stop film 171, an etch stop layer 195, and upper interconnection layers 210.

In the semiconductor device 100, the active region 105 may have a fin structure. For example, the active region 105 may protrude from an upper surface of the substrate 101. It should be noted that in some embodiments, the active region 105 may be part of the substrate 101, and in this manner, protruding from the substrate 101 may refer to a portion of the substrate 101 protruding past an upper surface of the substrate 101 (e.g., wherein the substrate 101 itself has protrusions that extend beyond a main surface thereof). The gate 160 may include a gate electrode layer 163 and a portion of the gate electrode layer 163 may be disposed between the active region 105 (e.g., a fin of the active region 105) and the channel structure 140 (e.g., channel layer 141), between the plurality of channel layers 141, 142, and 143 of the channel structures 140, and on an upper portion of the channel structure 140 (e.g., channel layer 143). Accordingly, the semiconductor device 100 may include a source/drain region 150, and a gate-all-around type field effect transistor formed by the gate structure 160, resulting in a multi-bridge channel FET (MBCFET™). The transistor may be, for example, an NMOS transistor or a PMOS transistor.

The substrate 101 may have an upper surface extending in an X-direction and a Y-direction. The substrate 101 may be formed of and/or include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The active region 105 may be defined (e.g., bordered) by the device isolation layer 110 on the substrate 101, and may be disposed to extend lengthwise in the X-direction. The active region 105 may have a structure protruding from the upper surface of the substrate 101 (e.g., a portion of the substrate 101 protruding from the upper surface of a main portion of the substrate 101 or a separate structure protruding from the upper surface of the substrate 101). An upper end of the active region 105 may be disposed to protrude to a predetermined height from (e.g., above) an upper surface of the device isolation layer 110. The active region 105 may be part of the substrate 101 (e.g., formed by etching the substrate 100), or may be formed on the substrate 100 (e.g., an epitaxial layer grown from the substrate 101). On opposite sides of the gate structure 160, a portion of the active region 105 on the substrate 101 may be recessed, and the source/drain region 150 may be disposed on the recessed active region 105. As illustrated in cross-section II-II' of FIG. 2A, the uppermost surface of the active region 105 may have a height relatively lower than that of a lower portion of the gate structure 160. The active region 105 may be provided in plural, and the plurality of active regions 105 may be disposed on the substrate 101 and may be spaced apart from each other in the Y-direction. In some example embodiments, the active regions 105 may include impurities, and at least some of a plurality of active regions 105 may include different conductivity types of impurities, but the present inventive concept is not limited thereto.

The channel structure 140 may include two or more channel layers disposed on the active region 105 and that are spaced apart from each other in a direction perpendicular to an upper surface of the active region 105, for example, a Z-direction. In the example illustrated in FIG. 2A, the two or more channel layers may include three layers such as first to third channel layers 141, 142, and 143. The first to third channel layers 141, 142, and 143 may be spaced apart from the upper surface of the active region 105 while being connected to the source/drain region 150. The first to third channel layers 141, 142, and 143 may have a width equal to or similar to that of the active region 105 in the Y-direction, and may have a width equal to or similar to that of the gate structure 160 in the X-direction. However, in some example embodiments, the first to third channel layers 141, 142, and 143 may have a reduced width such that side surfaces thereof are positioned below the gate structure 160 in the X-direction.

The first to third channel layers 141, 142, and 143 may be formed of and/or include a semiconductor material, and may include, for example, at least one of silicon (Si), silicon germanium (SiGe), and germanium (Ge). The first to third channel layers 141, 142, and 143 may be formed of and/or include a material that is the same as that of the substrate 101, for example. The number and shape of the plurality of channel layers 141, 142, and 143 forming one channel structure 140 may be changed in various manners in example embodiments. For example, in some example embodiments, the channel structure 140 may further include a channel layer disposed on the upper surface of the active region 105.

On opposite sides of the channel structure 140, the source/drain regions 150 may be disposed on the active region 105. Each source/drain region 150 may be provided as a source region or a drain region of a transistor. Each source/drain region 150 may be disposed in a corresponding recess of an upper portion of the active region 105. However, in example embodiments, presence or absence of a recess and a depth of the recess may be changed in various manners. Each source/drain region 150 may include epitaxial layers disposed along respective side surfaces of the first to third channel layers 141, 142, and 143 of the channel structure 140. The source/drain region 150 may include a plurality of epitaxial layers, but the present inventive concept is not limited thereto. The source/drain region 150 may be a semiconductor layer formed of and/or including silicon (Si) and/or germanium (SiGe). The source/drain regions 150 may include different types of impurities and/or impurities having different concentrations. For example, the source/drain regions 150 may include N-type doped silicon (Si) and/or P-type doped silicon germanium (SiGe). In example embodiments, the source/drain region 150 may include a plurality of regions including different concentrations of elements and/or doping elements. A cross-section of the source/drain regions 150 in the X-Y plane may have a circular shape, an elliptical shape, a pentagonal shape, a hexagonal shape, or a shape similar thereto. However, in example embodiments, the source/drain regions 150 may have various shapes, for example, one of a polygonal shape, a circular shape, and a rectangular shape.

The gate structure 160 may cross the active region 105 and the channel structures 140 on upper portions of the active region 105 and the channel structures 140, and may extend lengthwise in a direction, for example, the Y-direction. Channel regions of transistors may be formed in the active region 105 and the channel structures 140, intersecting the gate structure 160 in a direction, for example, the X-direction. The gate structure 160 may include a gate electrode layer 163, a gate dielectric layer 162 between the gate electrode layer 163 and each of the plurality of channel layers 141, 142, and 143, gate spacer layers 161 on side surfaces of the gate electrode layer 163, and a gate capping layer 164 on an upper surface of the gate electrode layer 163.

The gate dielectric layer 162 may be disposed between the active region 105 and the gate electrode layer 163 and between the channel structure 140 and the gate electrode layer 163, and may be disposed to cover at least a portion of surfaces of the gate electrode layer 163. For example, the gate dielectric layer 162 may be disposed to surround all surfaces except an uppermost surface of the gate electrode layer 163. The gate dielectric layer 162 may extend between the gate electrode layer 163 and the gate spacer layers 161, but the present inventive concept is not limited thereto. The gate dielectric layer 162 may be formed of and/or include an oxide, a nitride, or a high-κ material. The high-κ material may refer to a dielectric material having a dielectric constant higher than that of a silicon oxide film ($SiO_2$). The high-K material may refer to a dielectric material having a dielectric constant higher than that of a silicon oxide layer ($SiO_2$). The high-K material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($La_2O_3$), lanthanum hafnium oxide ($LaHf_xRO_y$), hafnium aluminum oxide ($HfAl_xO_y$), and praseodymium oxide ($Pr_2O_3$).

The gate electrode layer 163 may be disposed on the upper portion of the active region 105 to fill spaces between the plurality of channel layers 141, 142, and 143, and to extend past an upper portion of the channel structure 140. The gate electrode layer 163 may be spaced apart from the plurality of channel layers 141, 142, and 143 by the gate dielectric layer 162. The gate electrode layer 163 may be formed of and/or include a conductive material, and may include, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon.

The gate electrode layer 163 may be formed of and/or include two or more multilayers. The gate spacer layers 161 may be disposed on opposite sides of the gate electrode layer 163. The gate spacer layers 161 may insulate the source/drain region 150 from the gate electrode layer 163. The gate spacer layers 161 may have a multilayer structure in some example embodiments. The gate spacer layers 161 may be formed of and/or include at least one of an oxide, a nitride, an oxynitride, and a low-κ dielectric.

The gate capping layer 164 may be disposed on the gate electrode layer 163. The gate capping layer 164 may be disposed to extend along the upper surface of the gate electrode layer 163 in the second direction, for example, in the Y-direction. Side surfaces of the gate capping layer 164 may be surrounded by gate spacer layers 161. An upper surface of the gate capping layer 164 may be substantially coplanar with upper surfaces of the gate spacer layers 161, but the present inventive concept is not limited thereto. The gate capping layer 164 may be formed of and/or include oxide, nitride, and/or oxynitride, and specifically, may be formed of and/or include at least one of silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN).

Although not illustrated, the semiconductor device 100 may further include inner spacer layers. The inner spacer layers may be disposed to be parallel to the gate electrode layer 163 between the channel structures 140. Below a third channel layer 143, the gate electrode layer 163 may be spaced apart from the source/drain region 150 by the inner spacer layers to be electrically separated from each other. Side surfaces of the inner spacer layers, opposing the gate electrode layer 163, may be convexly rounded inwardly toward the gate electrode layer 163, but the present inventive concept is not limited thereto. The inner spacer layers may be formed of and/or include oxide, nitride and oxynitride, and in particular, may be formed of and/or include a low-κ film.

The inner spacer layers may be formed of and/or include a material the same as that of the gate spacer layers 161, but the present inventive concept is not limited thereto. For example, the inner spacer layers may be formed of and/or include at least one of silicon nitride ($Si_3N_4$), silicon carbonitride (SiCN), silicon oxycarbonitride (SiOCN), silicon boron carbon nitride (SiBCN), and silicon boron nitride (SiBN). The inner spacer layers may be applied to other example embodiments as well.

The first contact structure 180 may pass through the first interlayer insulating layer 191 in a vertical direction, for example, in the Z-direction, between two adjacent gates 160. The first contact structure 180 may be connected to a corresponding one of the source/drain regions 150. In example embodiments, a lower surface of the first contact structure 180 may be lower than an upper surface of the source/drain region 150. For example, a lower portion of the first contact structure 180 may be buried in the source/drain region 150. The first contact structure 180 may apply (e.g., transmit) an electrical signal to the source/drain regions 150. The first contact structure 180 may be disposed on the source/drain regions 150, and may be disposed to have a length in the Y-direction greater than that of the source/drain region 150 in some example embodiments. The first contact structure 180 may have an inclined side surface having a lower width becoming narrower than an upper width according to an aspect ratio, but the present inventive concept is not limited thereto. The first contact structure 180 may include a metal-semiconductor compound layer 182 disposed in a recess region (e.g., a recess) of the source/drain region 150, a plug conductive layer 186 on the metal-semiconductor compound layer 182, and a barrier layer 184 covering a lower surface and side surfaces of the plug conductive layer 186.

The metal-semiconductor compound layer 182 may be disposed in the recess region of the source/drain region 150. For example, the metal-semiconductor compound layer 182 may contact a surface of the recess region of the source/drain region 150. In example embodiments, an upper surface of the metal-semiconductor compound layer 182 may be coplanar with an upper surface of the source/drain region 150. The metal-semiconductor compound layer 182 may be formed of and/or include, for example, metal silicide, metal germanide, or metal silicide-germanide. In the metal-semiconductor compound layer 182, the metal may be titanium (Ti), nickel (Ni), tantalum (Ta), cobalt (Co), or tungsten (W), and the semiconductor may be silicon (Si), germanium (Ge), or silicon germanium (SiGe). For example, the metal-semiconductor compound layer 182 may be formed or and/or include at least one of cobalt silicide (CoSi), titanium silicide (TiSi), nickel silicide (NiSi), and tungsten silicide (WSi).

The barrier layer 184 may surround the lower surface and side surfaces of the plug conductive layer 186. The barrier layer 184 may be in contact with the metal-semiconductor compound layer 182. In example embodiments, the barrier layer 184 may contact an inner surface and an upper surface of the metal-semiconductor compound layer 182. The barrier layer 184 may conformally cover an inner wall of a contact hole. The barrier layer 184 may be formed of and/or include a metal nitride, for example, at least one of titanium nitride (TiN), tantalum nitride (TaN), and tungsten nitride (WN).

The plug conductive layer 186 may be disposed to fill a space between inner walls of the barrier layer 184. For example, the plug conductive layer 186 may be contact an inner surface of the barrier layer 184. Upper surfaces of the plug conductive layer 186 and the barrier layer 184 may be coplanar with an upper surface of the first interlayer insulating layer 191. The plug conductive layer 186 may be formed of and/or include a metal material, for example, at least one of aluminum (Al), copper (Cu), tungsten (W), cobalt (Co), ruthenium (Ru), and molybdenum (Mo).

The second contact structure 170 may be disposed on the first contact structure 180 and connected to the first contact structure 180. The second contact structure 170 may pass through the second interlayer insulating layer 192 in a vertical direction, for example, in the Z-direction. The second contact structure 170 may be a via, connecting the first contact structure 180 and an upper interconnection layer 210 to each other. The second contact structure 170 may include a first layer 172 including a first grain G1 and a second layer 174 including second grains G2 on the first layer 172. The first layer 172 may cover an upper surface of the first contact structure 180.

The first layer 172 may be formed of and/or include a metal material, for example, at least one of aluminum (Al), copper (Cu), tungsten (W), cobalt (Co), ruthenium (Ru), and molybdenum (Mo). According to an example embodiment, the first layer 172 may include a molybdenum (Mo) layer. Specifically, the molybdenum (Mo) layer of the first layer 172 may be monocrystalline.

The first layer 172 may be a monocrystalline conductive material. For example, the first layer may be formed using a selective crystal growth method to grow a monocrystalline conductive material. The monocrystalline conductive material may grow as a first grain G1, and thus the first grain G1 may define a vertical distance of the first layer 172. For example, within the first layer 172, a maximum vertical distance D1 between a lowermost end of the first grain G1 and an uppermost end of the first grain G1 may be substantially equal to a vertical distance D1 between a lowermost end of the first layer 172 and an uppermost end of the first layer 172. The first layer 172 may be formed by growing a specific crystal of a metal material layer on the plug conductive layer 186 of the first contact structure 180, and thus a seam 174a and/or a void 175 may not be formed. In addition, the first layer 172 may grow a specific crystal of the plug conductive layer 186 of the first contact structure 180, and thus may replace a high-resistance barrier metal layer (Ti/TiN), such that the second contact structure 170 may have lowered resistance.

A width W2 of a lower region of the first layer 172 may be greater than a width W1 of an upper region of the first contact structure 180, but the present inventive concept is not limited thereto. In an example embodiment, the width W2 of the lower region of the first layer 172 may be greater than the width W1 of the upper region of the first contact structure 180, such that the first layer 172 may be in contact with an upper surface of the plug conductive layer 186, an upper surface of the barrier layer 184, and an upper surface of the first interlayer insulating layer 191. A width W2 of a lowermost portion of the first layer 172 may be within a range of about 5 nm to about 20 nm. For example, the width W2 of the lowermost portion of the first layer 172 may be within a range of about nm to about 15 nm. Specifically, the width W2 of the lowermost portion of the first layer 172 may be measured to be about 10 nm.

The number of first grains G1 may be two or less. According to an example embodiment, the number of first grains G1 may be one. That is, the first layer 172 may be a monocrystal, and may include a monocrystalline conductive material. For example, the first layer 172 may include a monocrystalline conductive layer.

The second layer 174 may be formed on the first layer 172. For example, the second layer 174 may contact an upper surface of the first layer 172. The second layer 174 may be formed of and/or include a metal material, for example, at least one of aluminum (Al), copper (Cu), tungsten (W), cobalt (Co), ruthenium (Ru), and molybdenum (Mo). According to an example embodiment, the second layer 174 may include a molybdenum (Mo) layer. Specifically, the molybdenum (Mo) layer of the second layer 174 may be polycrystalline. The second layer 174 may have a polycrystalline structure having the second grains G2 having a size smaller than a size of the first grain G1, or may be amorphous or similar amorphous (AP). The number of second grains may be three or more. According to an example embodiment, the second layer 174 may include a polycrystalline conductive material. For example, the second layer 174 may include a polycrystalline conductive layer.

The second layer 174 may be formed by an atomic layer distribution (ALD) process. The second layer 174 may further include the seam 174a as shown in FIG. 2B. The second grains G2 may be formed from a side surface of the second layer 174 toward a central axis of the second contact structure 170, such that the second grains G2 may meet each other to form the seam 174a. The seam 174a may be vertically formed along the central axis of the second contact structure 170, but the present inventive concept is not limited thereto. The seam 174a may be positioned on a level higher than that of a boundary between the first layer 172 and the second layer 174.

The size of the first grain G1 may be greater than the size of each of the second grains G2. According to an example embodiment, the size of the first grain G1 may be greater than or equal to about 5 nm. The size of the first grain G1 may be a size to entirely fill the first layer 172. For example, the size of the first grain G1 may be substantially equal to a length D1 between an upper end of the first layer 172 and a lower end of the first layer 172. According to an example embodiment, the size of the first grain G1 may be measured to be about 10 nm.

The first layer 172 and the second layer 174 may be distinguished from each other by a precession electron diffraction (PED) analysis method using a transmission electron microscope (TEM). In the PED analysis method, internal structures of the first layer 172 and the second layer 174 may be analyzed, such that a boundary between the first grain G1 and the second grains G2 may be identified. In addition, the materials of the first layer 172 and the second layer 174 may be identified using component analysis.

The second contact structure 170 may have a tapered shape. For example, each of the first layer 172 and the second layer 174 may have an inclined side surface having a lower width becoming narrower than an upper width, and a width of the second layer 174 may be greater than a width of the first layer 172. According to an example embodiment, an extension line of a side surface of the first layer 172 and an extension line of a side surface of the second layer 174 may meet each other. For example, the extension line of side surface of the first layer 172 may align with the extension line of the side surface of the second layer 174.

A first length D1 between an upper portion (e.g., an upper end) of the first layer 172 and a lower portion (e.g., a lower end) of the first layer 172 may be greater than a second length D2 between an upper portion (e.g., an upper end) of the second layer 174 and a lower portion (e.g., a lower end) of the second layer 174. According to an example embodiment, the first length D1 between the upper portion of the first layer 172 and the lower portion of the first layer 172 may be within a range of about 3 nm to about 20 nm, and the second length D2 between the upper portion of the second layer 174 and the lower portion of the second layer 174 may be within a range of about 3 nm to about 10 nm. For example, the first length D1 may be within a range of about 10 nm to about 17 nm, and the second length D2 may be within a range of about 3 nm to about 7 nm. Specifically, the first length D1 may be about 15 nm, and the second length D2 may be about 5 nm. As described above, the first layer 172 may include a monocrystalline conductive material, which may be formed by the selective crystal growth method, such that the seam 174a or the void 175 may not be formed in the same manner as the second layer 174. Accordingly, the first layer 172 may have resistance lower than that of the second layer 174. When the first length D1 is greater than the second length D2, the semiconductor device 100, having electrical properties improved by the low-resistance second contact structure 170, may be provided.

The device isolation layer 110 may define (e.g., border) the active region 105 in the substrate 101. For example, the device isolation layer 110 may contact side surfaces of the active region 105. An upper surface of the device isolation layer 110 may be lower than an upper surface of the active region 105. The device isolation layer 110 may be formed by, for example, a shallow trench isolation (STI) process. In some example embodiments, the device isolation layer 110 may further include a region extending more deeply while having a step toward a lower portion of the substrate 101. The device isolation layer 110 may partially expose the upper portion of the active region 105. In some example embodiments, the device isolation layer 110 may have a curved upper surface having a higher level as a distance to the active region 105 decreases. The device isolation layer 110 may be formed of and/or include an insulating material. The device isolation layer 110 may be, for example, an oxide, a nitride, or a combination thereof.

The interlayer insulating layers 191, 192, and 193 include a first interlayer insulating layer 191, a second interlayer insulating layer 192, and a third interlayer insulating layer 193 sequentially disposed on the substrate 101. The first interlayer insulating layer 191 may be disposed to cover the source/drain regions 150, side surfaces of the gate structure 160, and side surfaces of the first contact structure 180. The second interlayer insulating layer 192 may be disposed on the gate structures 160. The second interlayer insulating layer 192 may contact side surfaces of the first layer 172 and the second layer 174 of the second contact structure 170. The third interlayer insulating layer 193 may be an insulating layer in a region in which the upper interconnection layer 210 is disposed. The interlayer insulating layers 191, 192, and 193 may be formed of and/or include, for example, at least one of an oxide, a nitride, and an oxynitride, and may include a low-K material.

The etch stop film 171 may be disposed between the first interlayer insulating layer 191 and the second interlayer insulating layer 192. The etch stop film 171 may contact an upper surface of the first interlayer insulating layer 191, a lower surface of the second interlayer insulating layer 192, and a side surface of the first layer 172 of the second contact structure 170. The etch stop film 171 may be disposed between the gate capping layer 164 and the second interlayer insulating layer 192. The etch stop film 171 may contact an upper surface of the gate capping layer 164. The etch stop film 171 may be formed of and/or include a material having etch selectivity with respect to the interlayer insulating layers 191, 192, and 193. For example, the etch stop film 171 may be formed of and/or include silicon nitride, silicon carbonitride, aluminum nitride, or aluminum oxide.

The etch stop layer 195 may be disposed between the second insulating interlayer 192 and the third insulating interlayer 193. The etch stop layer 195 may contact an upper surface of the second insulating interlayer 192 and a lower surface of the third insulating interlayer 193. The etch stop layer 195 may be at a higher vertical level than the second layer 174 of the second contact structure 170. The etch stop layer 195 may be formed of and/or include a material having etch selectivity with respect to the interlayer insulating layers 191, 192, and 193. The etch stop layer 195 may be formed of and/or include aluminum oxide, aluminum nitride, aluminum oxynitride, or a combination thereof. The etch stop layer 195 may further include at least one of titanium (Ti), tantalum (Ta), cobalt (Co), zirconium (Zr), ruthenium (Ru), lanthanum (La), and hafnium (Hf) in addition to aluminum (Al).

The upper interconnection layers 210 may be disposed on the second contact structure 170. In some embodiments, the upper interconnection layers 210 may have a circular shape when viewed in plan view. In other embodiments, the upper interconnection layers 210 may have a linear shape extending in the Y-direction, for example. The upper interconnection layers 210 may pass through the etch stop layer 195. Widths of the upper interconnection layers 210 in the X-direction may be greater than a width of the second contact structure 170, but the present inventive concept is not limited thereto. The upper interconnection layer 210 may include an upper barrier layer 214 and a metal layer 216. The upper barrier layer 214 may be formed of and/or include a metal nitride, for example, at least one of titanium nitride (TiN), tantalum nitride (TaN), and tungsten nitride (WN). The metal layer 216 may be formed of and/or include a metal material, for example, at least one of aluminum (Al), copper (Cu), tungsten (W), cobalt (Co), ruthenium (Ru), or molybdenum (Mo).

A description of the first contact structure 180 according to the present inventive concept may also be equally applied to a contact structure or a via structure in a volatile memory device such as a dynamic RAM (DRAM), a static RAM (SRAM), or the like, or a non-volatile memory device such as a phase change RAM (PRAM), a magnetic RAM (MRAM), a resistive RAM (RRAM), a flash memory, or the like. For example, in a NAND flash memory device, contact plugs, connected to staircase-shaped gate electrodes, may have a structure the same as that of the first contact structure 180 according to the present inventive concept.

In the following embodiments, descriptions overlapping the above descriptions of FIGS. 1 to 2B may be omitted.

FIGS. 2C to 4C are partially enlarged cross-sectional views illustrating a semiconductor device each according to an example embodiment of the present inventive concept. Each of FIGS. 2C to 4C illustrates a region corresponding to region "A" of FIG. 2A.

Figure 2C:
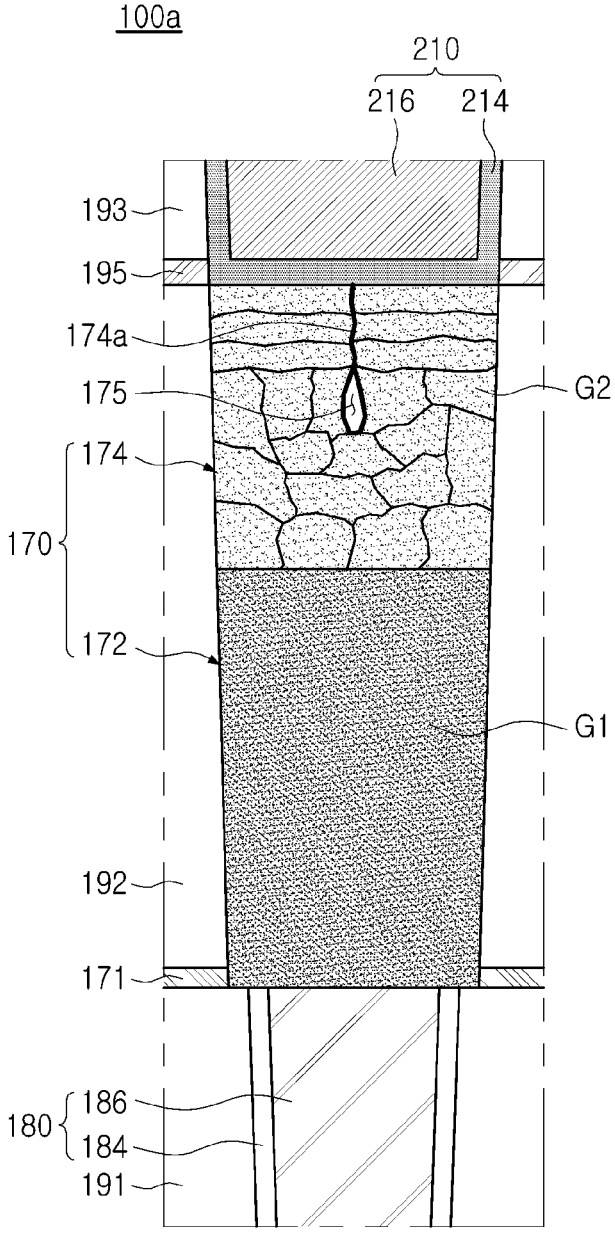

Referring to FIG. 2C, a semiconductor device 100a may further include a void 175 between second grains G2. The void 175 may include air or gas formed of a material used in a process of manufacturing the semiconductor device 100a. In some embodiments, the void 175 may comprise a gap forming a vacuum therein. The void 175 may be formed between the second grains G2 in a process of forming a second layer 174 to be described below. Such a configuration may also be applied to other example embodiments.

Figure 2D:
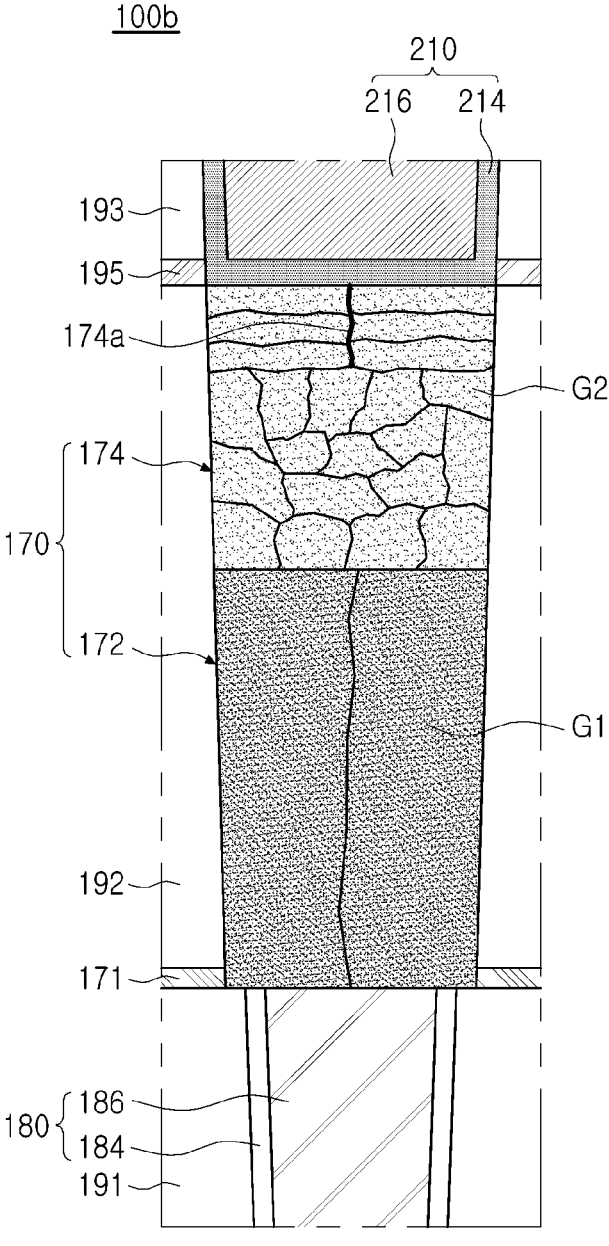

Referring to FIG. 2D, a semiconductor device 100b may include two first grains G1. When a selective crystal growth method of a first layer 172 is performed, a specific crystal of a metal material layer may be grown on a plug conductive layer 186 including a metal material. The plug conductive layer 186 may include a polycrystalline conductive material. In a process of growing the first grain G1 of the metal material layer on the plug conductive layer 186, the first grain G1 may be divided into two first grains G1. A size of the first grain G1 may be greater than a size of each of second grains G2.

Figure 3A:
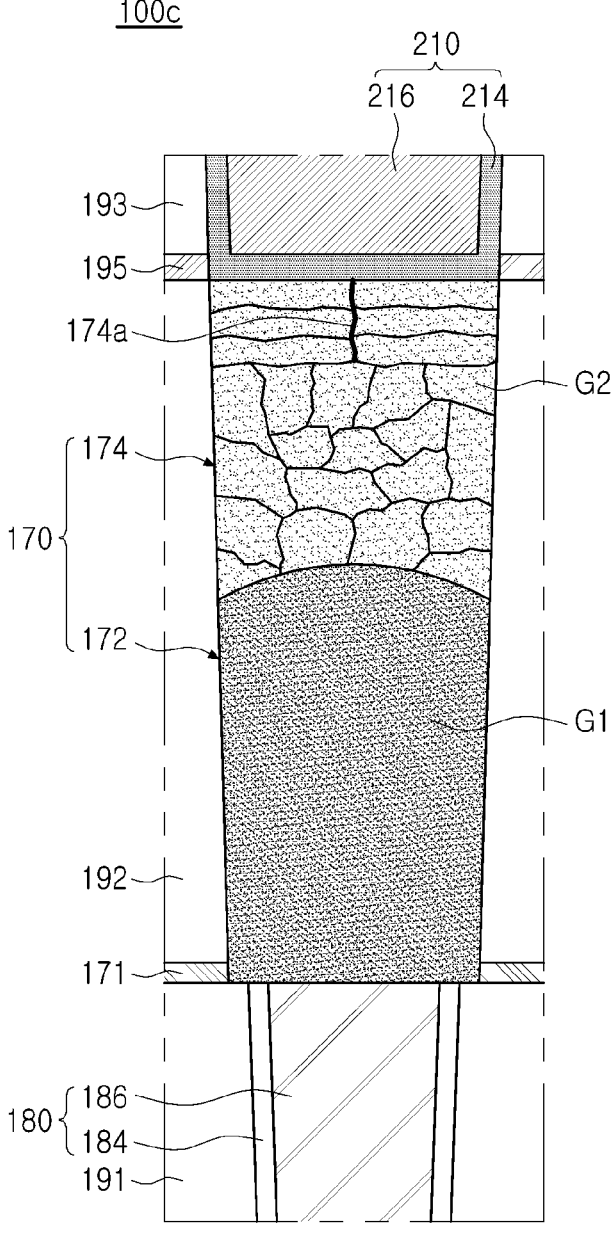

Referring to FIG. 3A, a first layer 172 of a semiconductor device 100c may have a convex surface. According to an example embodiment, at least a portion of an upper surface of the first layer 172 may have an upwardly convex surface. The first layer 172 may be left-right symmetric with respect to a central axis of a second contact structure 170, but the present inventive concept is not limited thereto. A central portion of the upper surface of the first layer 172 may have a region protruding toward a first upper metal layer 176, but the present inventive concept is not limited thereto. An uppermost portion of the first layer 172 may be positioned on a level higher than that of a lowermost portion of a second layer 174. For example, a central portion of a lower surface of the second layer 174 may be at a higher level than side portions of the lower surface of the second layer 174.

Figure 3B:
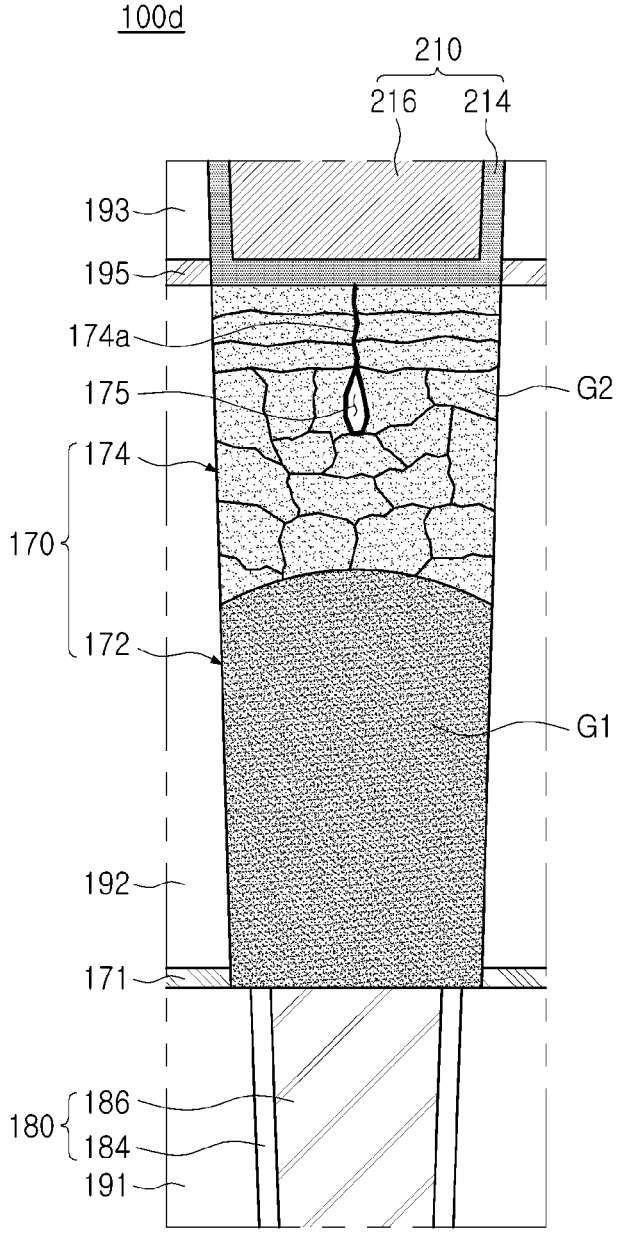

Referring to FIG. 3B, a semiconductor device 100d may further include a void 175 between second grains G2, as compared to the semiconductor device 100c of FIG. 3A. It may be understood that the void 175 has characteristics substantially the same as those of the above-described void 175 of the example embodiment of FIG. 2C.

Figure 3C:
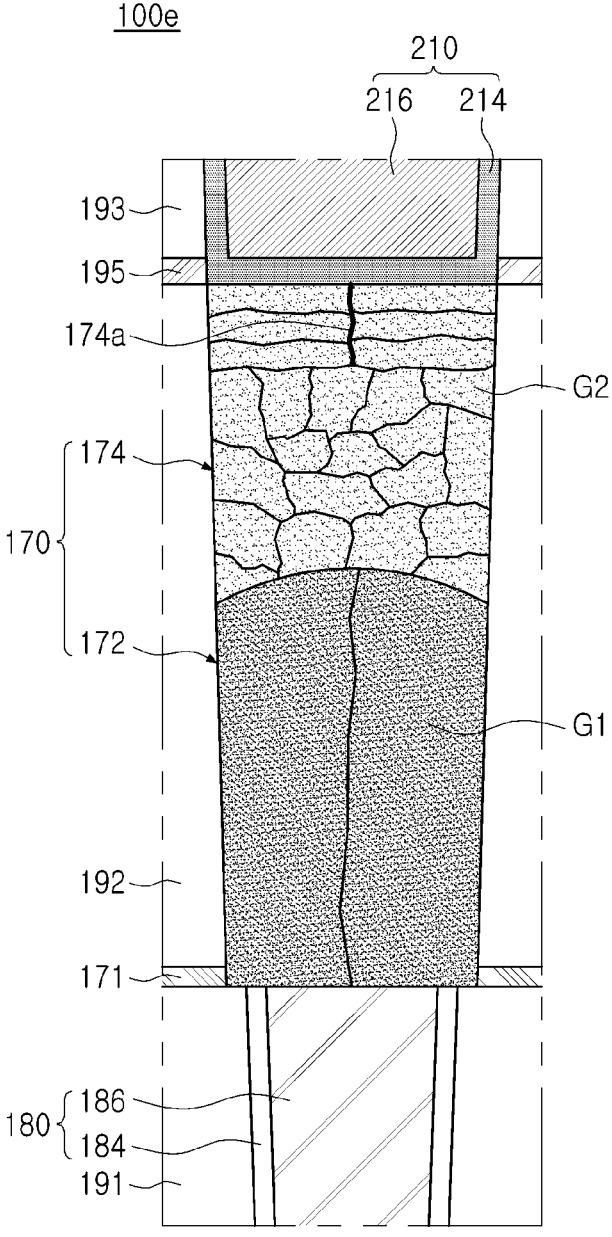

Referring to FIG. 3C, a semiconductor device 100e may include a first grain G1 different from that of the semiconductor device 100c of FIG. 3A in terms of size and number. It may be understood that the first grain G1 has characteristics substantially the same as those of the above-described first grain G1 of the example embodiment of FIG. 2D.

Figure 4A:
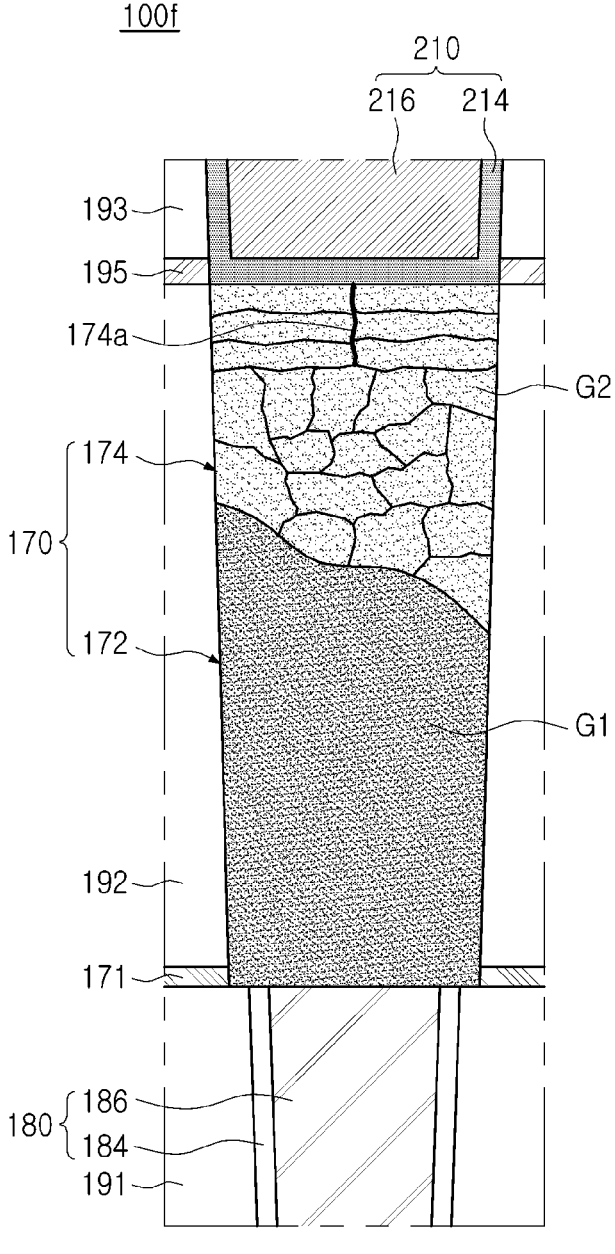

Referring to FIG. 4A, in a semiconductor device 100f, at least a portion of an upper surface of the first layer 172 may have a convex shape. The first layer 172 may be asymmetrical with respect to a central axis of a second contact structure 170. In a process of forming the first layer 172 by a selective crystal growth method, a growth rate of a crystal growing along a sidewall of the first layer 172 may be different. Thus, an uppermost portion of the first layer 172 may be positioned on a level higher than that of a lowermost portion of a second layer 174. A shape of the first layer 172 is not limited to the shape illustrated in FIG. 4A.

Figure 4B:
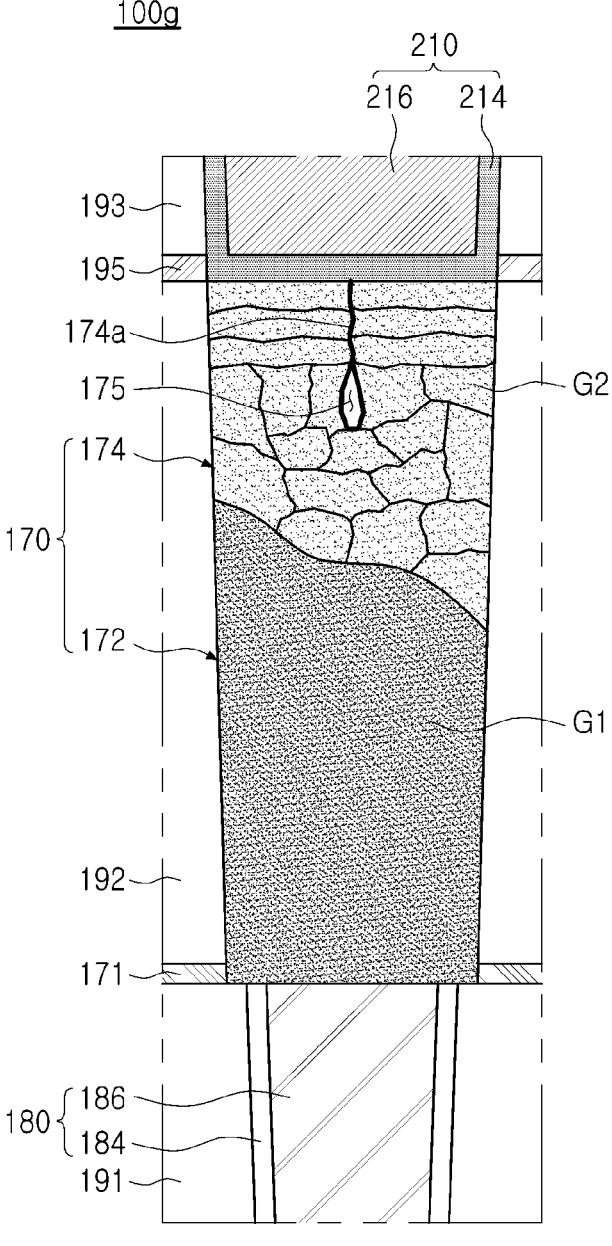

Referring to FIG. 4B, a semiconductor device 100g may further include a void 175 between second grains G2. It may be understood that the void 175 has characteristics substantially the same as those of the above-described void 175 of the example embodiment of FIG. 2C.

Figure 4C:
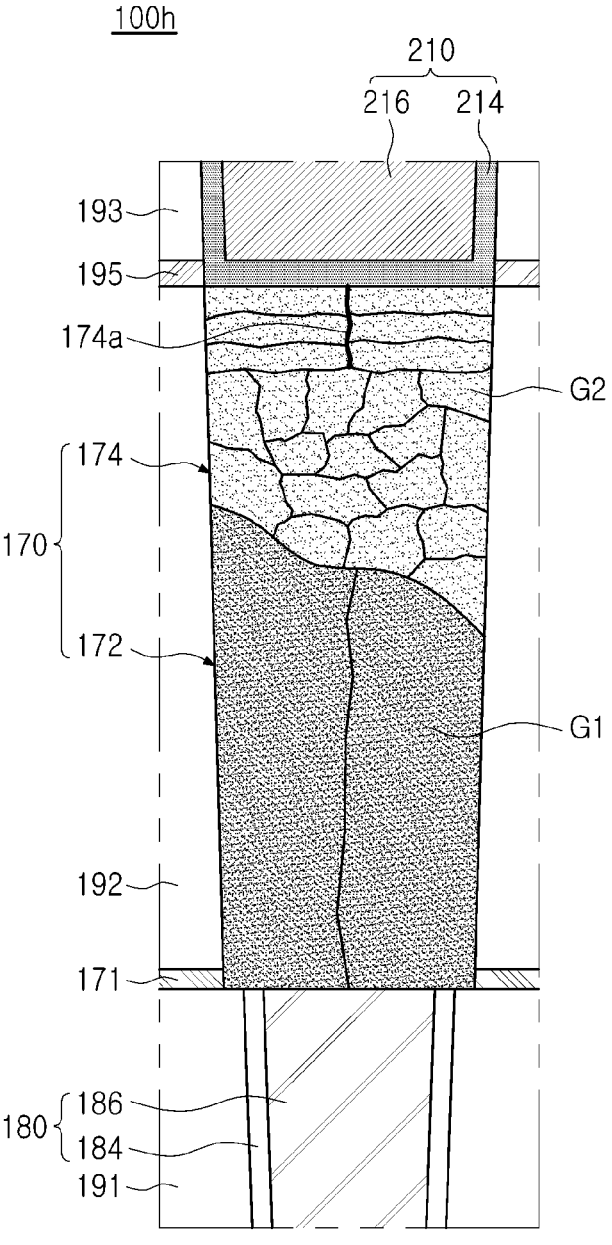

Referring to FIG. 4C, a semiconductor device 100h may include a first grain G1 different from that of the semiconductor device 100f of FIG. 4A in terms of size and number. It may be understood that the first grain G1 has characteristics substantially the same as those of the above-described first grain G1 of the example embodiment of FIG. 2D.

Figure 5:
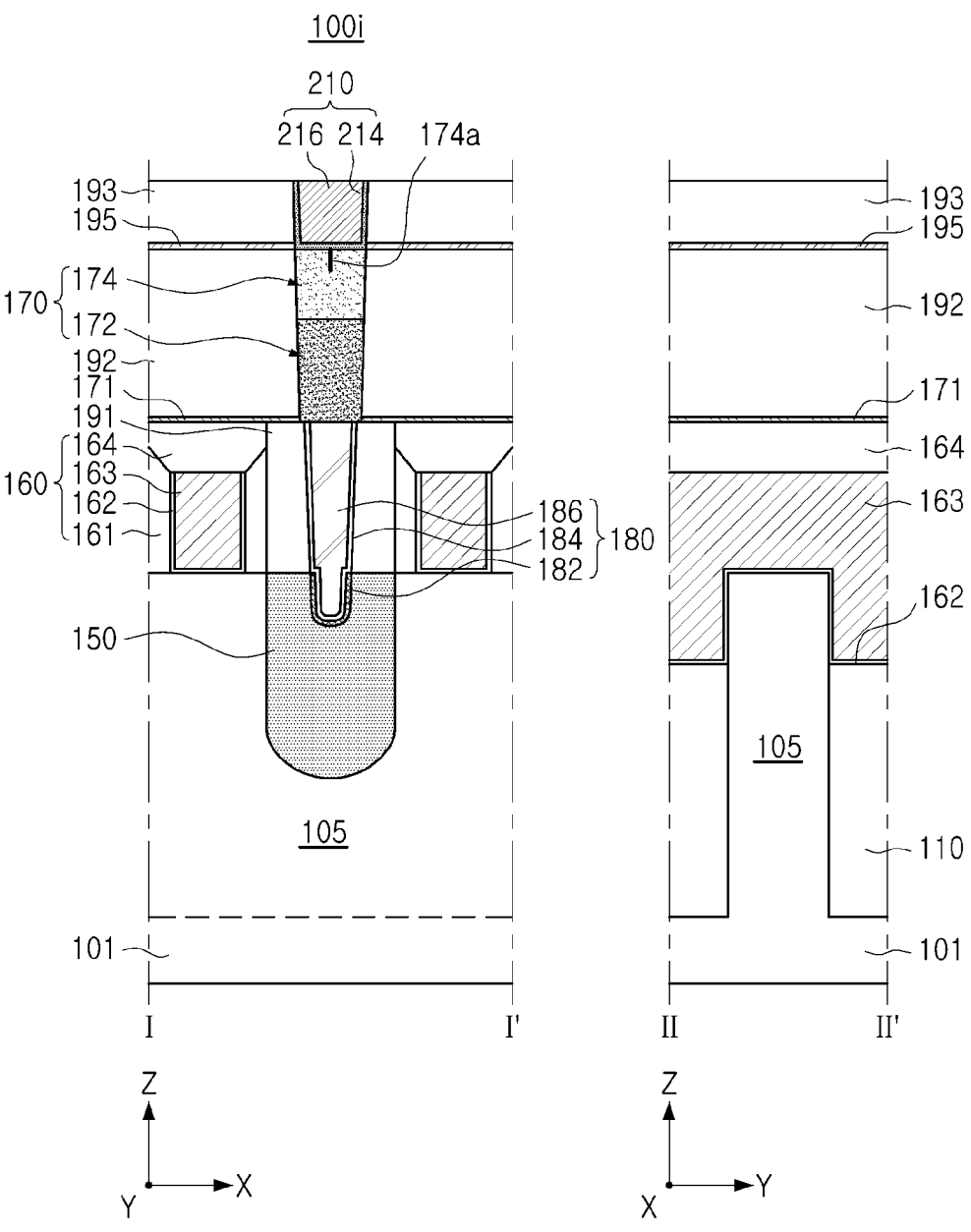
FIG. 5 is a cross-sectional view illustrating a semiconductor device according to an example embodiment of the present inventive concept.

Referring to FIG. 5, a semiconductor device 100*i* may include a substrate 101, an active region 105, device isolation layer 110, a source/drain region 150, gate structures 160, a first contact structure 180, a second contact structure 170, interlayer insulating layers 191, 192, and 193, an etch stop film 171, an etch stop layer 195, and upper interconnection layers 210. The semiconductor device 100*i* may include a fin field effect transistor (FinFET) device in which the active region 105 is a transistor having a fin structure. The FinFET device may include transistors disposed with respect to the active region 105 and the gate structures 160, crossing each other. For example, the transistors may be NMOS transistors or PMOS transistors.

The source/drain region 150 may be provided in plural, and each of the source/drain regions 160 may be disposed on a corresponding one of recess regions (e.g., a recess in the active region 105) in which the active region 105 has recesses on opposite sides of the gate structures 160. The recesses may extend in an X-direction between the gate structures 160, and may have inner walls positioned at opposite ends in the X-direction and a bottom surface between the inner walls. The source/drain region 150 may be provided as a source region or drain region of a transistor. Relative heights of the source/drain region 150 and the gate structures 160 may be changed in various manners in some example embodiments. For example, the source/drain region 150 may have an elevated source/drain shape in which an upper surface thereof is positioned to be higher than the gate structures 160, in particular, a lower surface of the gate electrode layer 163, but the present inventive concept is not limited thereto. Such a configuration may also be applied to other example embodiments.

Figure 6A:
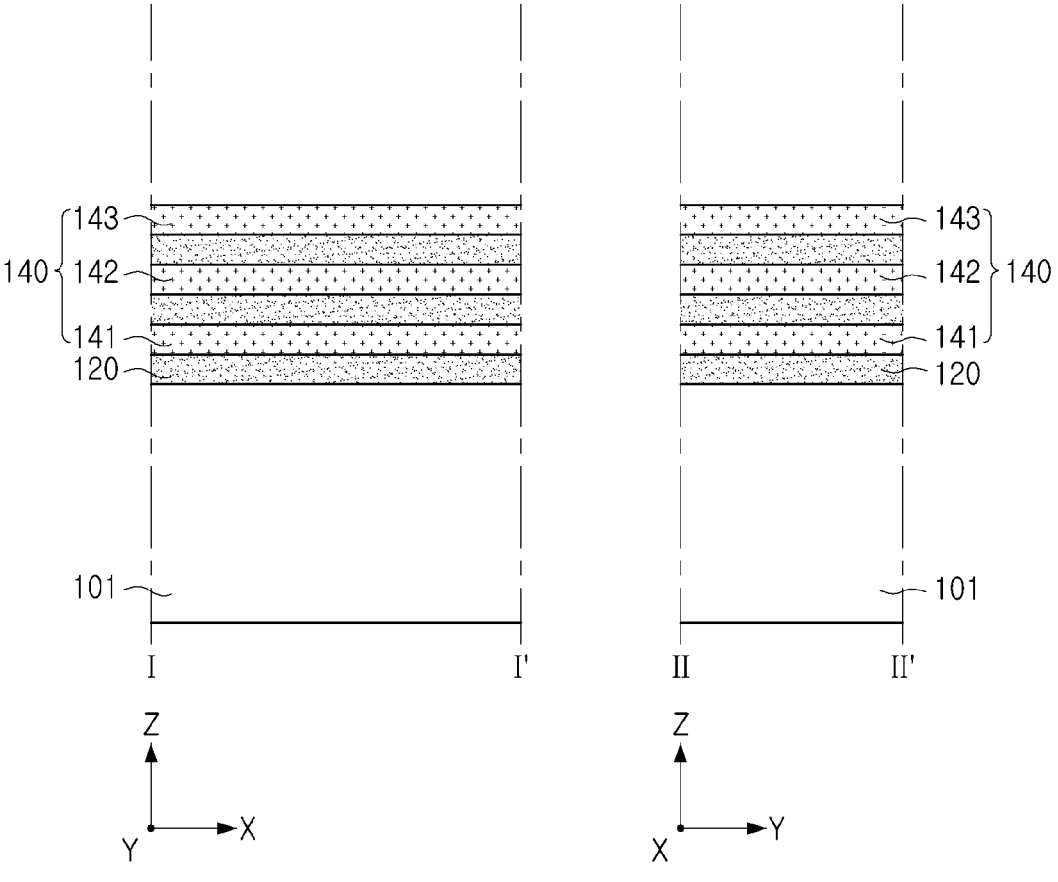
FIGS. 6A to 6K are cross-sectional views and partially enlarged views illustrating a process sequence so as to describe a method of manufacturing a semiconductor device according to an example embodiment of the present inventive concept.
Figure 6B:
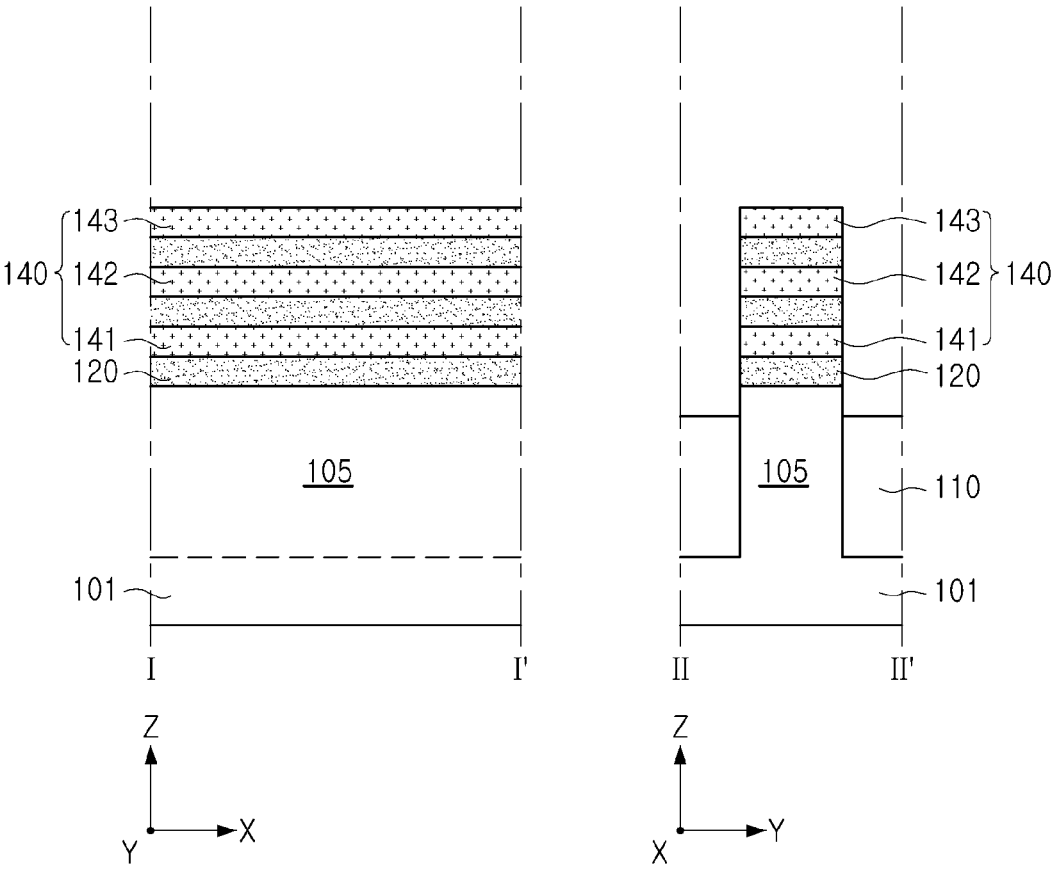
Figure 6C:
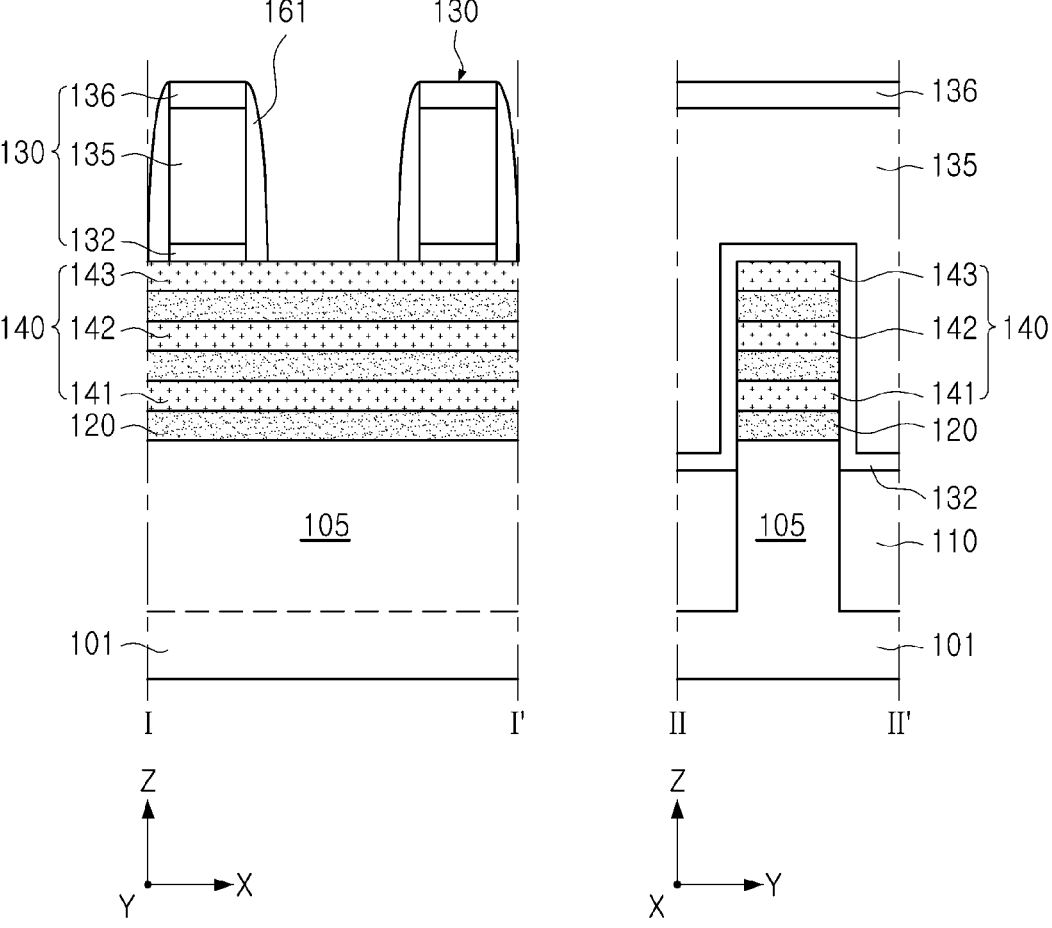
Figure 6D:
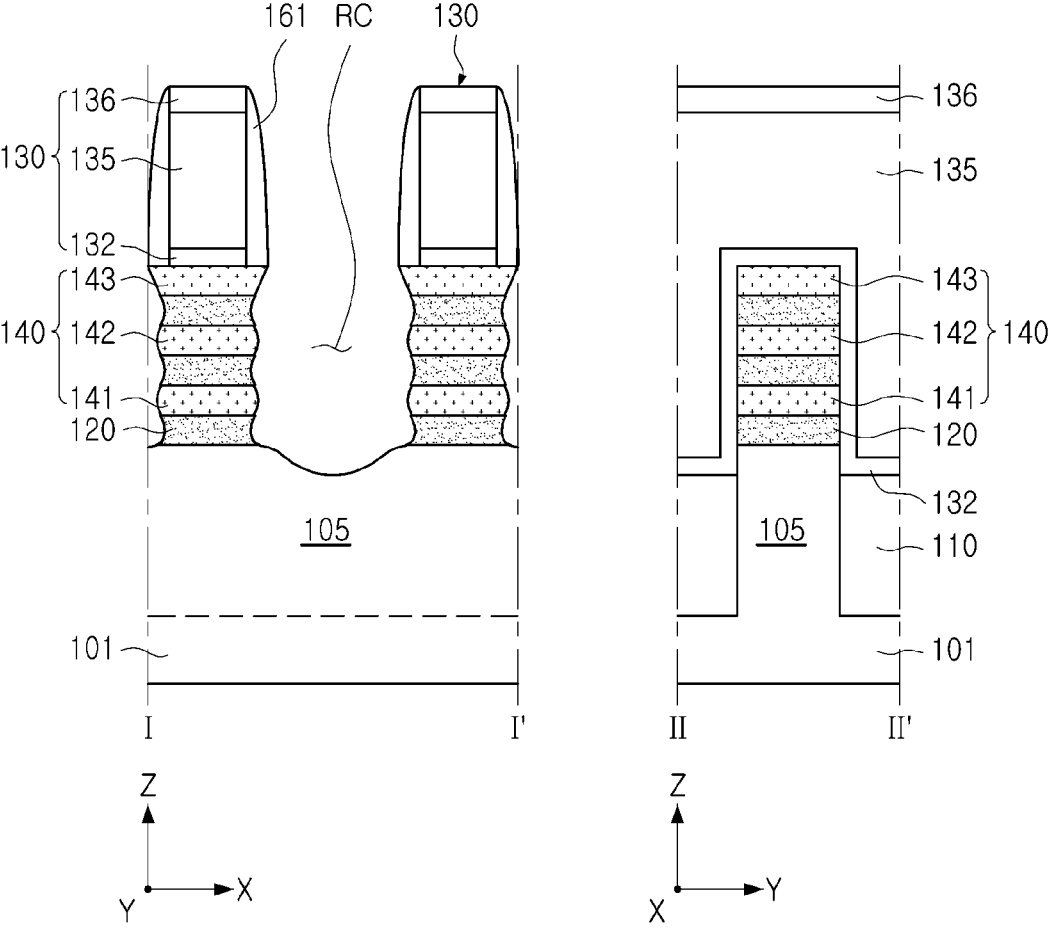
Figure 6E:
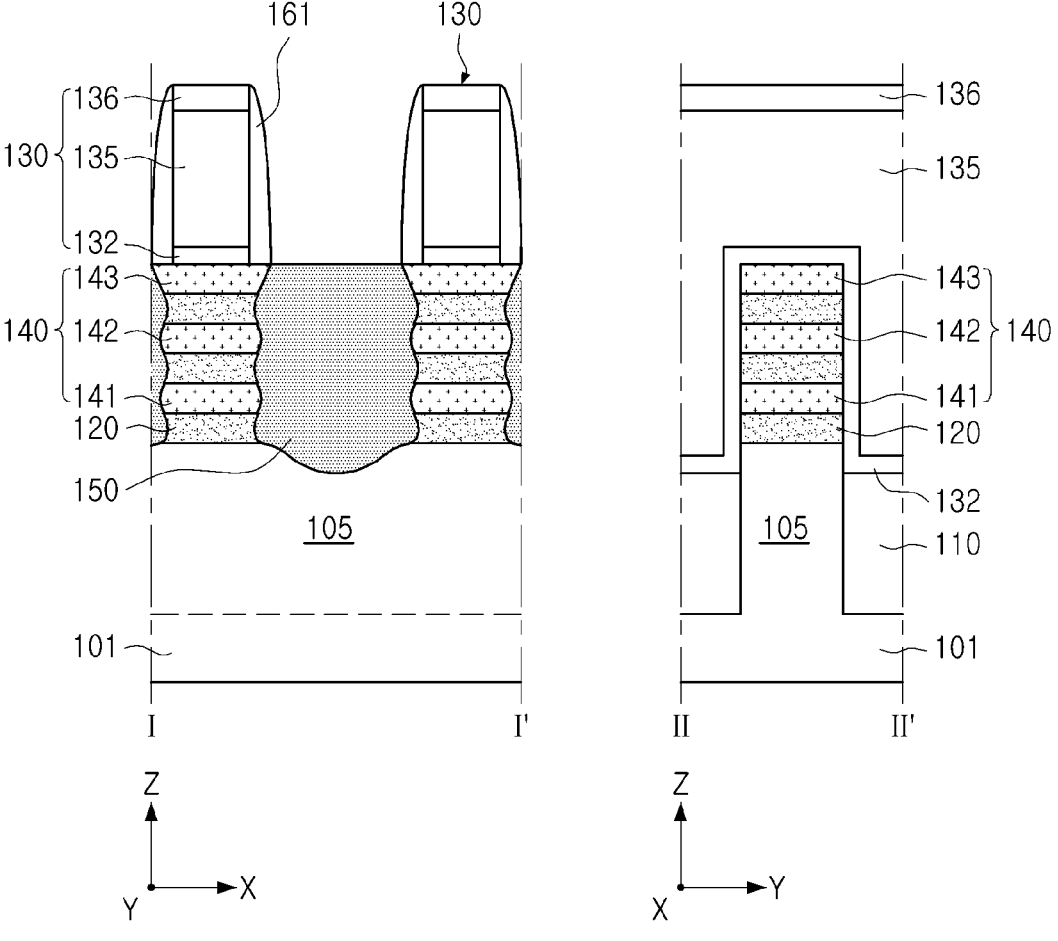
Figure 6F:
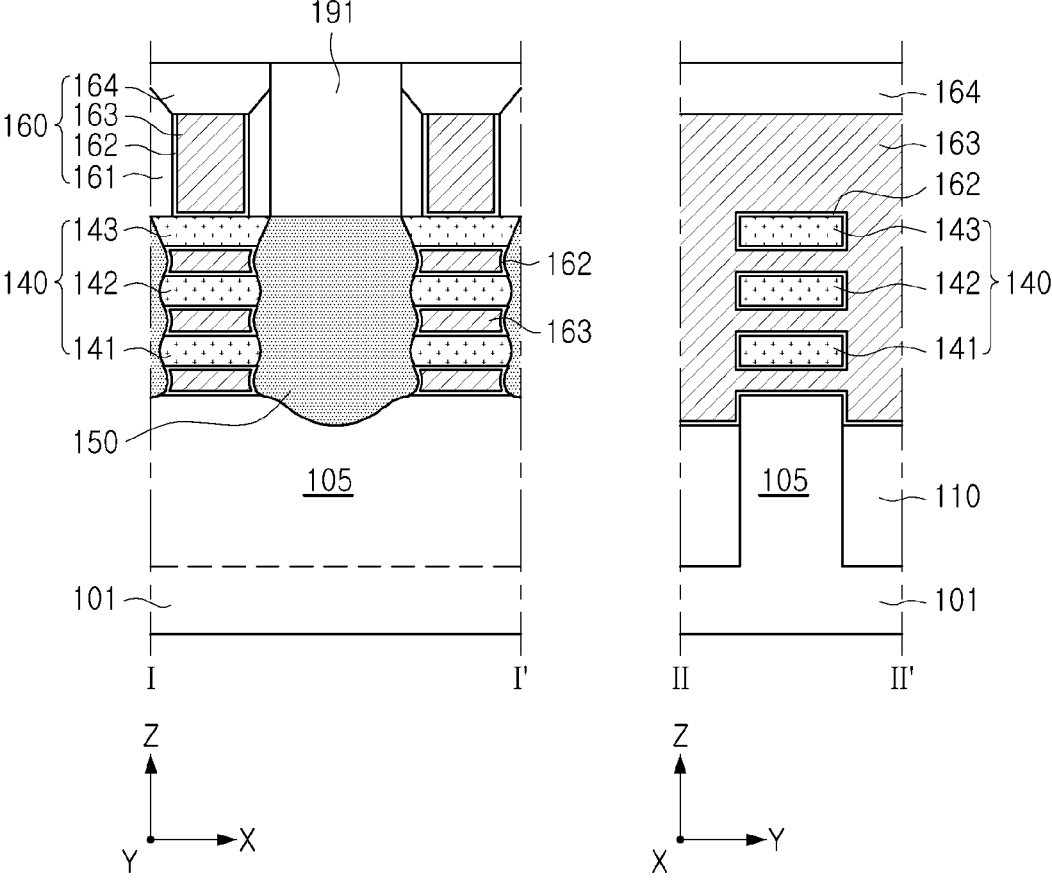
Figure 6G:
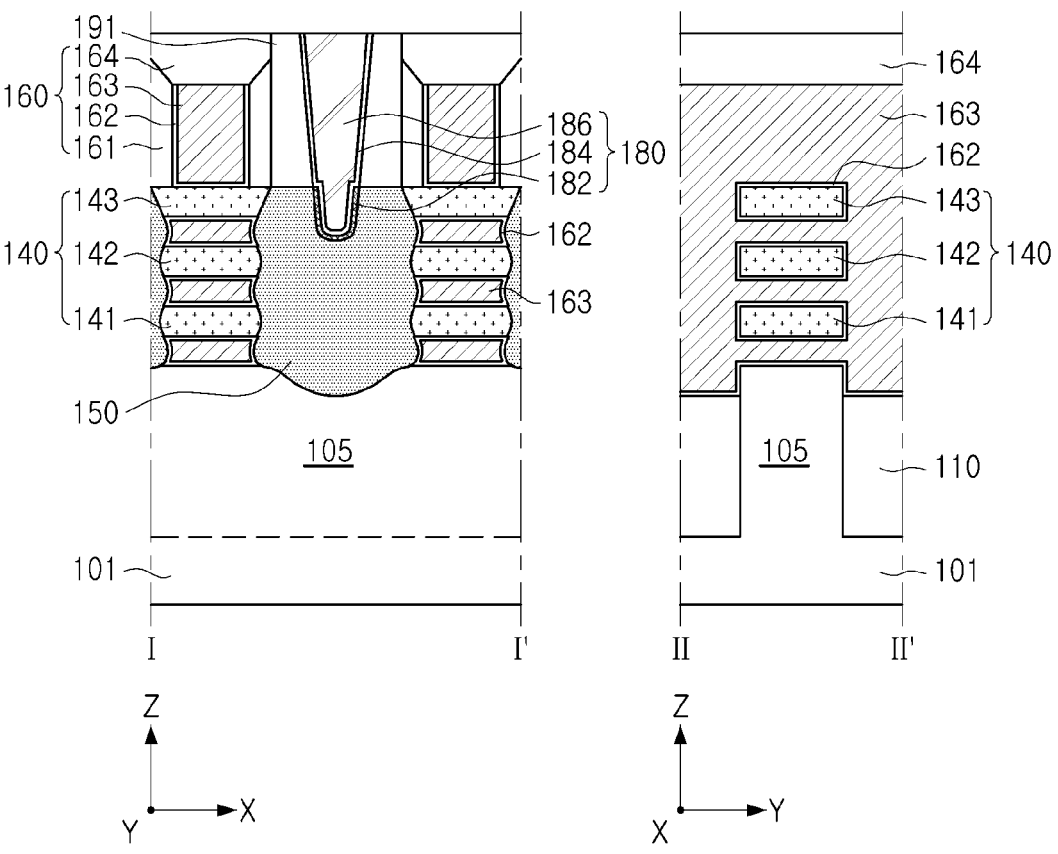
Figure 6H:
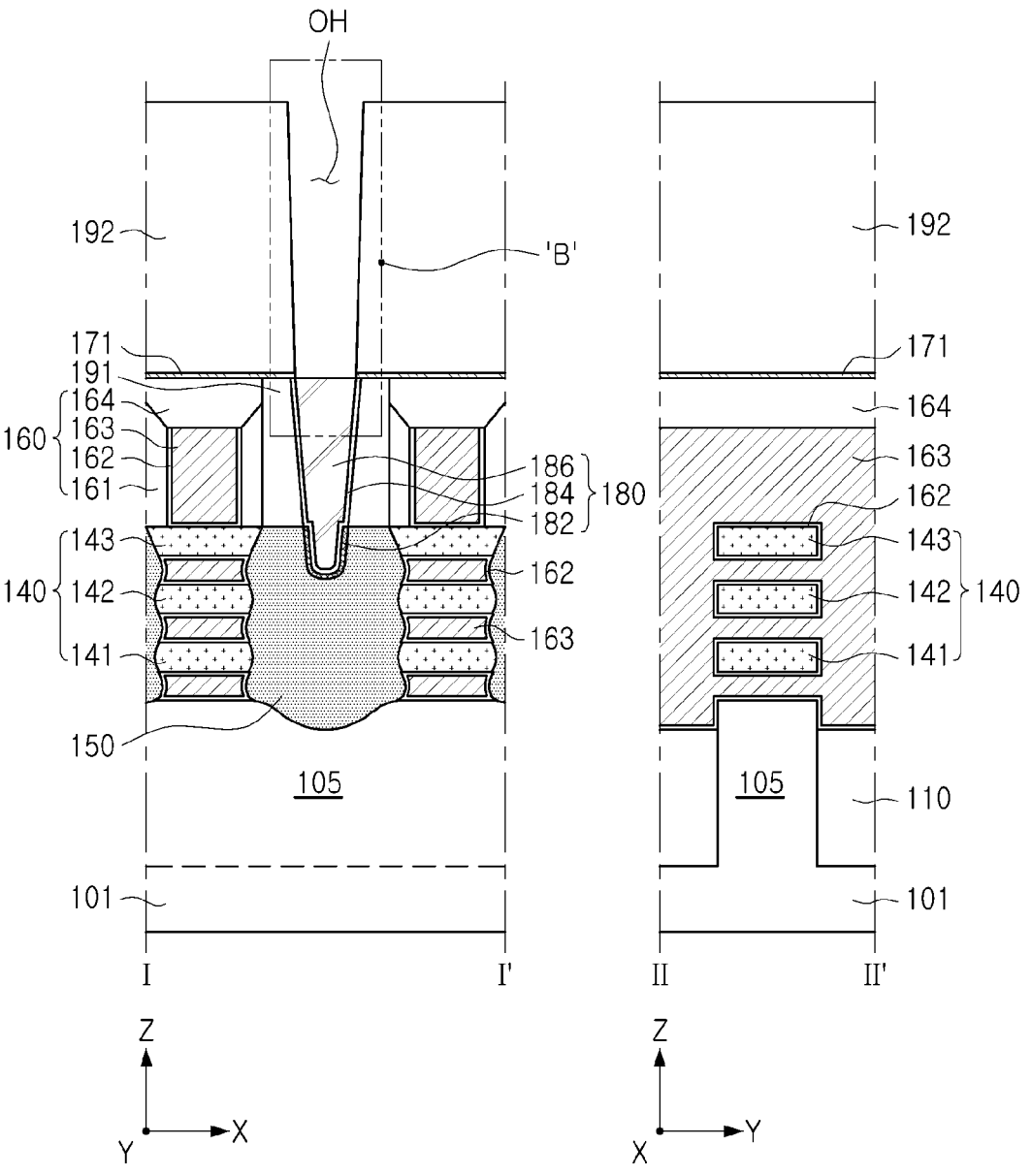
Figure 6I:
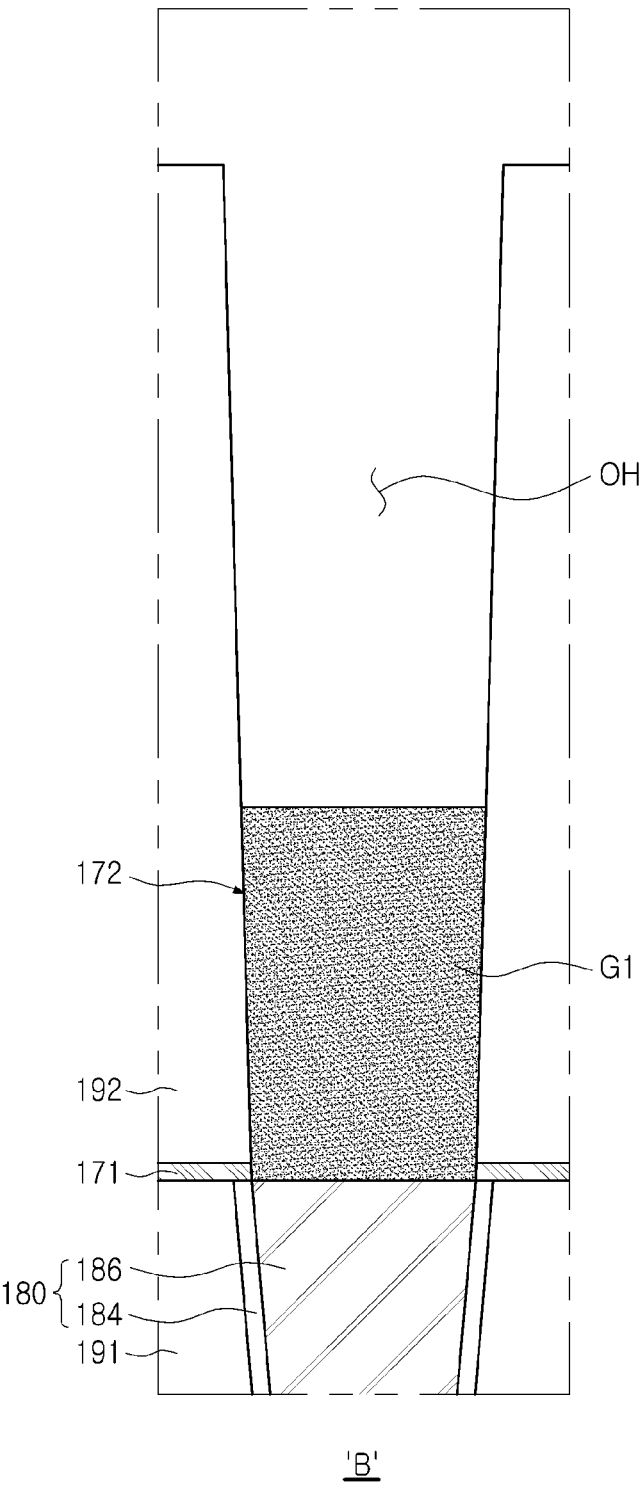
Figure 6J:
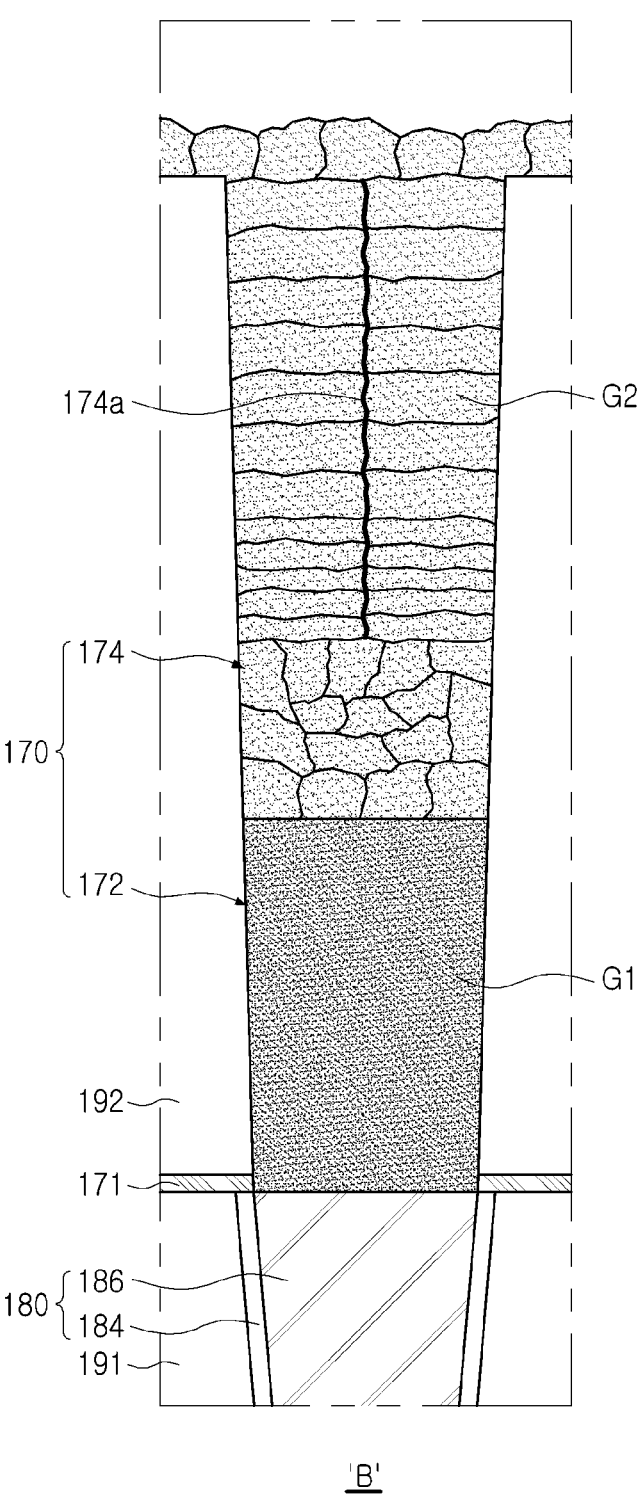

FIGS. 6A to 6K are cross-sectional views and partially enlarged views illustrating a process sequence so as to describe a method of manufacturing a semiconductor device according to an example embodiment of the present inventive concept. FIGS. 6A to 6H and FIG. 6K illustrate regions corresponding to FIG. 2A, and FIGS. 6I and 6J illustrate regions corresponding to region "B" of FIG. 6H.

Referring to FIG. 6A, sacrificial layers 120 and a plurality of channel layers 141, 142, and 143 may be alternately stacked on a substrate 101.

The sacrificial layers 120 may be layers that will be replaced with a gate dielectric layer 162 and a gate electrode layer 163 through subsequent processes, as illustrated in FIG. 2. The sacrificial layers 120 may be formed of and/or include a material having etch selectivity with respect to the plurality of channel layers 141, 142, and 143. The plurality of channel layers 141, 142, and 143 may include a material different from that of the sacrificial layers 120. In an example embodiment, the plurality of channel layers 141, 142, and 142 may include silicon (Si), and the sacrificial layers 120 may include silicon germanium (SiGe).

The sacrificial layers 120 and the plurality of channel layers 141, 142, and 143 may be formed by performing an epitaxial growth process using the substrate 101 as a seed. Each of the sacrificial layers 120 and the plurality of channel layers 141, 142, and 143 may have a thickness ranging from about 1 Å to about 100 nm. The number of layers of the plurality of channel layers 141, 142, and 143 alternately stacked with the sacrificial layer 120 may be changed in various manners in example embodiments.

Referring to FIG. 6B, active structures may be formed by removing a portion of the substrate 101 and a stack structure of the sacrificial layers 120 and the plurality of channel layers 141, 142, and 143.

The active structure may include the sacrificial layers 120 and the plurality of channel layers 141, 142, and 143, alternately stacked with each other, and may further include an active region 105 formed to protrude toward an upper surface of the substrate 101 by removing a portion of the substrate 101. The active structures may be formed to have a linear shape extending lengthwise in one direction, for example, an X-direction, and may be disposed to be spaced apart from each other in a Y-direction.

In a region in which a portion of the substrate 101 is removed, the device isolation layer 110 may be formed by filling an insulating material to the sides of the active region 105 up to a height just below a height of the active region 105 such that the active region 105 protrudes past an upper surface of the device isolation layer 110. Upper surfaces of the device isolation layer 110 may be formed to be lower than an upper surface of the active region 105.

Referring to FIG. 6C, sacrificial gate structures 130 and gate spacer layers 161 may be formed on the active structures.

The sacrificial gate structures 130 may be sacrificial structures formed in a region in which the gate dielectric layer 162 and the gate electrode layer 163 are disposed on an upper portion of the channel structure 140 through a subsequent process, as illustrated in FIG. 2A. The sacrificial gate structures 130 may include first and second sacrificial gate layers 132 and 135 and a mask pattern layer 136, sequentially stacked. The first and second sacrificial gate layers 132 and 135 may be patterned using the mask pattern layer 136. The first and second sacrificial gate layers 132 and 135 may be an insulating layer and a conductive layer, respectively. For example, the first sacrificial gate layer 132 may include silicon oxide, and the second sacrificial gate layer 135 may include polysilicon. The mask pattern layer 136 may include silicon nitride. The sacrificial gate structures 130 may have a linear shape, intersecting the active structures and extending lengthwise in one direction. The sacrificial gate structures 130 may be disposed to extend in the Y-direction, and to be spaced apart from each other in the X-direction.

The gate spacer layers 161 may be formed on opposite sidewalls of the sacrificial gate structures 130. The gate spacer layers 161 may be formed by forming a film having uniform thickness along upper surfaces and side surfaces of the sacrificial gate structures 130 and the active structures, and then anisotropically etching the film. The gate spacer layers 161 may be formed of and/or include a low-K material, and may include, for example, at least one of silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN).

Referring to FIG. 6D, the exposed sacrificial layers 120 and the exposed plurality of channel layers 141, 142, and 143 may be removed between the sacrificial gate structures 130 to form a recess region RC, thereby forming channel structures 140.

The exposed sacrificial layers 120 and the exposed plurality of channel layers 141, 142, and 143 may be removed using the sacrificial gate structures 130 and the gate spacer layers 161 as a mask. Remaining sacrificial layers 120 may be selectively etched with respect to the channel structures 140 by, for example, a wet etching process and may be removed to a predetermined depth from side surfaces thereof in the X-direction, and thus may have inwardly concave side surfaces. The side surfaces of the remaining plurality of channel layers 141, 142, and 143 in the X-direction may be etched to have outwardly convex side surfaces. However, shapes of the side surfaces of the sacrificial layers 120 and the plurality of channel layers 141, 142, and 143 are not limited to those illustrated. The side surfaces of the sacrificial layers 120 and the plurality of channel layers 141, 142, and 143 may be formed to be coplanar in a direction perpendicular to the upper surface of the substrate 101.

Referring to FIG. 6E, the source/drain region 150 may be formed by forming an epitaxial layer within the recess region RC.

The source/drain regions 150 may be formed by a proper epitaxial growth process. The source/drain regions 150 may be formed by epitaxial growth, and may extend to be in contact with the plurality of channel layers 141, 142, and 143 and the sacrificial layers 120 within the recess region RC. A surface of the source/drain region 150 in contact with the plurality of channel layers 141, 142, and 143 and the sacrificial layers 120 may have a wavy shape. The source/drain regions 150 may include impurities by in-situ doping.

Referring to FIG. 6F, a gate structure 160 may be formed by forming a first interlayer insulating layer 191 on the source/drain regions 150, and removing the sacrificial layers 120 and the sacrificial gate structures 130.

The first interlayer insulating layer 191 may be formed by forming an insulating film, covering the sacrificial gate structures 130 and the source/drain regions 150, and performing a planarization process.

The sacrificial layers 120 and the sacrificial gate structures 130 may be selectively removed with respect to the gate spacer layers 161, the first interlayer insulating layer 191, and the plurality of channel layers 141, 142, and 143. For example, when the sacrificial layers 120 include silicon germanium (SiGe) and the plurality of channel layers 141, 142, and 143 include silicon (Si), the sacrificial layers 120 may be selectively removed by performing a wet etching process using peracetic acid as an etchant.

The sacrificial gate structures 130 may be removed to expose a portion of the active region 105 between the gate spacer layers 161.

In a region in which the sacrificial gate structures 130 are removed, the gate structure 160 may be formed by forming the gate dielectric layer 162, the gate electrode layer 163, and a gate capping layer 164. The gate dielectric layer 162 may be formed to conformally cover an upper surface and side surfaces of the active region 105 and inner walls of the gate spacer layers 161. The gate dielectric layer 162 may contact the upper and side surfaces of the active region 105. An upper portion of the gate electrode layer 163 may be partially removed to a predetermined depth to form the gate capping layer 164.

Referring to FIG. 6G, a first contact structure 180, passing through the first interlayer insulating layer 191, may be formed between adjacent gate structures 160.

First, a contact hole may be formed by patterning the first interlayer insulating layer 191. The contact hole may partially recess upper portions of the source/drain regions 150. A metal-semiconductor compound layer 182 may be formed in a lower portion of the contact hole. The metal-semiconductor compound layer 182 is formed by selectively depositing a metal-semiconductor compound forming the metal-semiconductor compound layer 182 in the contact hole, or siliciding or germanizing a portion of a semiconductor material of the source/drain region 150.

Subsequently, a conductive material may be deposited to conformally cover the inner surfaces of the metal-semiconductor compound layer 182 and the contact hole to form a barrier layer 184, and a conductive material may be deposited to fill the contact hole to form a plug conductive layer 186. By the present operation, the first contact structure 180 including the metal-semiconductor compound layer 182, a barrier layer 184, and the plug conductive layer 186 may be formed. A lower end of the metal-semiconductor compound layer 182 may be positioned on a level lower than that of upper ends of the plurality of channel layers 141, 142, and 143. However, a shape and an arrangement of the first contact structure 180 are not limited thereto, and may be changed in various manners. In an example embodiment, the barrier layer 184 may be formed by performing a tungsten (W) plasma vapor deposition (PVD) process, and the plug conductive layer 186 may be formed by performing a chemical vapor deposition (CVD) process.

Referring to FIG. 6H, a second interlayer insulating layer 192 may be formed on the first interlayer insulating layer 191, and openings OH, passing through the second interlayer insulating layer 192 in a Z-direction, may be formed. The openings OH may expose a portion of an upper surface of the first contact structure 180.

FIGS. 6I and 6J illustrate a process of forming the second contact structure 170 in more detail. FIGS. 6I and 6J are enlarged views of region "B" of FIG. 6H.

Referring to FIG. 6I, a first layer 172 may be formed in the openings OH.

The first layer 172 may be formed by performing a selective crystal growth method. When the selective crystal growth method is performed, a specific crystal of a metal material layer may be grown on the plug conductive layer 186 including a metal material. The first layer 172 may be formed of and/or include a monocrystalline conductive material. The number of first grains G1 may be two or less. According to an example embodiment, the number of first grains G1 may be one.

The first layer 172 may be formed to a predetermined thickness from lower ends of the openings OH. An upper surface of the first layer 172 may be convex, but the present inventive concept is not limited thereto. A thickness of the first layer 172 may be adjusted depending on a condition of the selective crystal growth method. The first layer 172 may be formed by the selective crystal growth method, and may include a monocrystalline conductive material, such that a seam 174a and/or a void 175 may not be formed, thereby lowering the resistance of the second contact structure 170, and preventing defects in a subsequent planarization process or cleaning process.

Referring to FIG. 6J, a second layer 174 may be formed on the first layer 172 within the openings OH.

The second layer 174 may be formed using an ALD process or a CVD process. The second layer 174 may be formed to fill a space between inner walls of the openings OH and to extend to an upper portion of the second interlayer insulating layer 192. In the second layer 174, the seam 174a may be formed by second grains G2. The second layer 174 may be formed to cover a portion of the upper surface of the second interlayer insulating layer 192. A process of forming the first layer 172, and then forming the second layer 174 may be performed such that the second contact structure 170 may have resistance reduced by about 50% or more, as compared to a second contact structure formed through a single process.

Figure 6K:
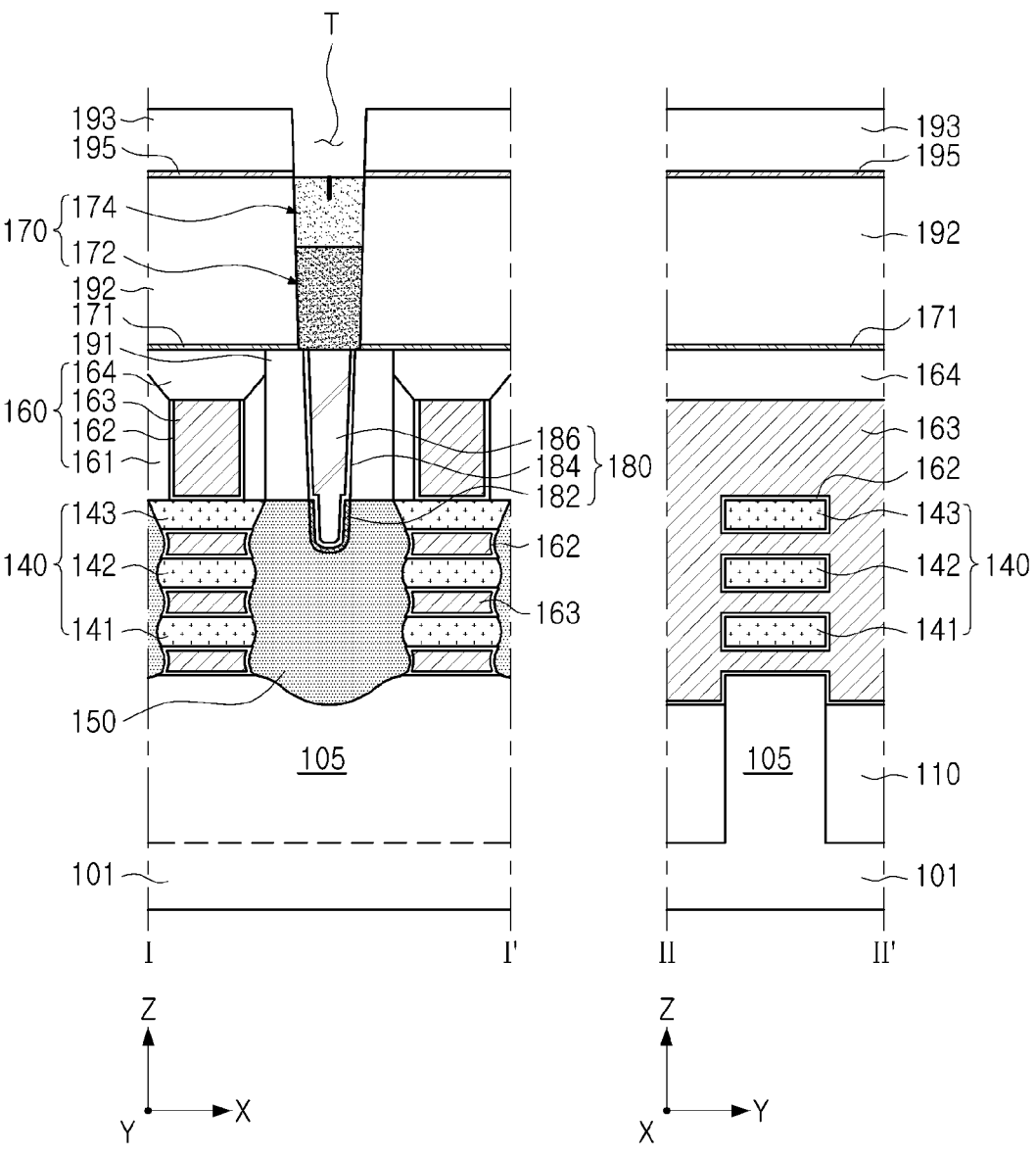

Referring to FIG. 6K, a planarization process may be performed to remove a portion of the second layer 174 to form the second contact structure 170. After a portion of the second layer 174 is removed, an etch stop layer 195 and a third interlayer insulating layer 193 may be formed, and a trench T, passing therethrough and extending in the Y-direction, may be formed.

During the planarization process, portions of the second layer 174 and the second interlayer insulating layer 192 may be removed. Accordingly, the second contact structure 170 including the first layer 172 and the second layer 174 may be formed.

When the trench T is formed, the etch stop layer 195 may serve as a stopper to stop etching from an upper portion of the third interlayer insulating layer 193. A portion of the etch stop layer 195 may also be removed within the trench T to expose a portion of the second layer 174 of the second contact structure 170.

Subsequently, referring to FIG. 2A, the semiconductor device 100 may be manufactured by forming an upper interconnection layer 210 within the trench T.

A first layer including a monocrystalline conductive material may be formed, and then a second layer including a polycrystalline conductive material may be formed, such that a size of a first grain of the first layer may be greater than a size of a second grain of the second layer, thereby providing a semiconductor device having improved electrical properties.

The various and beneficial advantages and effects of aspects of the present inventive concept are not limited to those set forth herein, and will be more easily understood in the course of describing specific example embodiments.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
an active region extending in a first direction on a substrate;
a gate structure extending in a second direction on the substrate, crossing the active region, and including a gate electrode;
a source/drain region on the active region on at least one side of the gate structure; a first contact structure connected to the source/drain region on the at least one side of the gate structure; and
a second contact structure connected to the first contact structure and disposed on the first contact structure,
wherein the second contact structure includes a first layer including a first grain and a second layer including second grains on the first layer,
wherein the first layer is disposed between the second layer and the first contact structure,
wherein within the first layer, a maximum vertical distance between a lowermost end of the first grain and an uppermost end of the first grain is equal to a vertical distance between a lowermost end of the first layer and an uppermost end of the first layer, wherein a size of the first grain is greater than a size of each of the second grains, and
wherein a width of the first layer is greater than a width of the first contact structure.

2. The semiconductor device of claim 1, wherein the first layer includes a monocrystalline molybdenum layer, and the second layer includes a polycrystalline molybdenum layer.

3. The semiconductor device of claim 1, wherein the first layer has a convex surface in contact with the second layer.

4. The semiconductor device of claim 1, wherein the size of each of the at least one first grain is about 5 nm or more.

5. The semiconductor device of claim 1, wherein: the first layer includes two or less of the first grain, and the number of the second grains is three or more.

6. The semiconductor device of claim 1, further comprising: a void between at least two of the second grains.

7. The semiconductor device of claim 1, wherein a first length between an upper end of the first layer and a lower end of the first layer is greater than a second length between an upper end of the second layer and a lower end of the second layer.

8. The semiconductor device of claim 1, wherein a width of the first layer is within a range of about 5 nm to about 20 nm.

9. The semiconductor device of claim 1, wherein the first contact structure includes a metal-semiconductor compound layer in a recess region of the source/drain region, a plug conductive layer on the metal-semiconductor compound layer, and a barrier layer covering a lower surface and side surfaces of the plug conductive layer.

10. The semiconductor device of claim 9, wherein the first layer is in contact with an upper surface of the plug conductive layer and the barrier layer.

11. The semiconductor device of claim 1, further comprising:
a plurality of channel layers on the active region spaced apart from each other in a vertical direction, perpendicular to an upper surface of the substrate,
wherein the gate crosses the plurality of channel layers on the substrate, surrounds a portion of each of the plurality of channel layers, and extends in the second direction.

12. A semiconductor device comprising:
an active region extending in a first direction on a substrate;
a gate structure extending in a second direction on the substrate, crossing the active region, and including a gate electrode;
a source/drain region disposed on the active region on at least one side of the gate structure;
a first contact structure connected to the source/drain region on the at least one side of the gate structure; and
a second contact structure connected to the first contact structure and disposed on the first contact structure,
wherein the second contact structure includes a first layer including a first grain and a second layer including second grains and disposed on the first layer,
wherein the first layer is disposed between the second layer and the first contact structure,
wherein the first layer includes a monocrystalline conductive material, wherein the second layer includes a polycrystalline conductive material, and
wherein a size of the first grain is greater than a size of each of the second grains.

13. The semiconductor device of claim 12, wherein an extension line of a side surface of the first layer and an extension line of a side surface of the second layer meet each other.

14. The semiconductor device of claim 12, wherein:
the second layer includes a seam between at least two of the second grains, and the seam is positioned on a level higher than that of a boundary between the first layer and the second layer.

15. The semiconductor device of claim 12, wherein a first width of a lower portion of the first layer is greater than a second width of an upper portion of the first contact structure.

16. The semiconductor device of claim 12, wherein an uppermost end of the first layer is positioned on a level higher than that of a lowermost end of the second layer.

17. The semiconductor device of claim 12, wherein:

each of the first layer and the second layer has an inclined side surface having a lower width becoming narrower than an upper width, and a width of the second layer is greater than a width of the first layer.

18. The semiconductor device of claim 12, wherein:

a first length between an upper portion of the first layer and a lower portion of the first layer is within a range of about 3 nm to about 20 nm, and a second length between an upper portion of the second layer and a lower portion of the second layer is within a range of about 3 nm to about 10 nm.

19. A semiconductor device comprising:

first and second interlayer insulating layers on a substrate;

a first contact structure passing through the first interlayer insulating layer that is on the substrate;

a second contact structure passing through the second interlayer insulating layer, the second contact structure in contact with an upper surface of the first contact structure; and a metal interconnection in contact with an upper surface of the second contact structure, the metal interconnection extending in a first direction, wherein the second contact structure includes a first layer including a first grain and a second layer including second grains on the first layer, wherein the first layer is disposed between the second layer and the first contact structure, wherein the first layer includes a monocrystalline conductive material, wherein the second layer includes a polycrystalline conductive material, wherein a size of the first grain is greater than a size of each of the second grains, and wherein a width of the first layer is greater than a width of the first contact structure.

20. The semiconductor device of claim 19, wherein a first length between an upper end of the first layer and a lower end of the first layer is greater than a second length between an upper end of the second layer and a lower end of the second layer.

* * * * *